US010032491B2

(12) United States Patent
La Fratta

(10) Patent No.: US 10,032,491 B2
(45) Date of Patent: Jul. 24, 2018

(54) APPARATUSES AND METHODS FOR STORING A DATA VALUE IN MULTIPLE COLUMNS

(71) Applicant: Micron Technology, Inc., Boise, ID (US)

(72) Inventor: Patrick A. La Fratta, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/399,315

(22) Filed: Jan. 5, 2017

(65) Prior Publication Data

US 2017/0117020 A1  Apr. 27, 2017

Related U.S. Application Data

(62) Division of application No. 14/826,481, filed on Aug. 14, 2015.

(60) Provisional application No. 62/045,305, filed on Sep. 3, 2014.

(51) Int. Cl.
*G11C 7/10* (2006.01)
*G11C 7/06* (2006.01)

(52) U.S. Cl.
CPC ............ *G11C 7/065* (2013.01); *G11C 7/1009* (2013.01); *G11C 7/1051* (2013.01)

(58) Field of Classification Search
CPC . G11C 11/4091; G11C 11/4096; G11C 7/065; G11C 7/1006; G11C 7/1009; G11C 7/106; G11C 7/1051
USPC .......... 365/189.011, 189.05, 189.08, 189.15, 365/189.16, 205, 207, 208
See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |

(Continued)

FOREIGN PATENT DOCUMENTS

| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — Gene Auduong
(74) *Attorney, Agent, or Firm* — Brooks, Cameron & Huebsch, PLLC

(57) ABSTRACT

An example apparatus comprises an array of memory cells coupled to sensing circuitry. The apparatus can include a control component configured to cause computing of a data value equal to a logical OR between the digit of a mask and a data value stored in a memory cell located in a row at a column of the array corresponding to a digit of a vector stored in the array. The control component can cause storing of the data value equal to the logical OR in the memory cell located in the row at the column of the array corresponding to the digit of the vector.

17 Claims, 13 Drawing Sheets

(56) References Cited

U.S. PATENT DOCUMENTS

| | | |
|---|---|---|
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,747,960 B2 * | 8/2017 | La Fratta .......... G11C 7/06 |
| 2001/0007112 A1 | 7/2001 | Porterfield |
| 2001/0008492 A1 | 7/2001 | Higashiho |

(56) References Cited

U.S. PATENT DOCUMENTS

| | | |
|---|---|---|
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |
| 2016/0155482 A1* | 6/2016 | La Fratta ............... G11C 7/06 365/189.011 |
| 2016/0266873 A1* | 9/2016 | Tiwari ............... G11C 7/1006 |
| 2017/0133066 A1* | 5/2017 | Tiwari ............... G11C 7/22 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

(56) References Cited

OTHER PUBLICATIONS

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for related PCT Application No. PCT/US2015/047692, dated Dec. 14, 2015, 13 pages.

\* cited by examiner

| | | 1444 | 1445 | 1456 | 1470 | 1471 | | | |
|---|---|---|---|---|---|---|---|---|---|
| | | A | B | NOT OPEN | OPEN TRUE | OPEN INVERT | | | |
| | | 0 | 0 | 0 | 0 | 1 | | | |
| | | 0 | 1 | 0 | 1 | 0 | | | |
| | | 1 | 0 | 1 | 0 | 1 | | | |
| | | 1 | 1 | 1 | 1 | 0 | | | |

| | | | | | | | | | | |
|---|---|---|---|---|---|---|---|---|---|---|
| FF | 0 | 0 | 0 | 0 | 0 | 0 | 1 | 1 | 1 | ←1476 |
| FT | 0 | 0 | 0 | 1 | 1 | 1 | 0 | 0 | 0 | ←1477 |
| TF | 0 | 0 | 1 | 0 | 0 | 1 | 0 | 0 | 1 | ←1478 |
| TT | 0 | 1 | 0 | 0 | 1 | 0 | 0 | 1 | 0 | ←1479 |
| A | B | A | A*B | A*B̄ | A+B | B | AXB | A+B̄ | $\overline{AXB}$ | B̄ |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

APPARATUSES AND METHODS FOR STORING A DATA VALUE IN MULTIPLE COLUMNS

PRIORITY INFORMATION

This application is a Divisional of U.S. application Ser. No. 14/826,481, filed Aug. 14, 2015, which is a Non-Provisional of U.S. Provisional Application No. 62/045,305, filed Sep. 3, 2014, the contents of which are incorporated herein by reference.

TECHNICAL FIELD

The present disclosure relates generally to semiconductor memory and methods, and more particularly, to apparatuses and methods related to storing a data value in multiple columns of a memory array.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array). A PIM device may save time by reducing and/or eliminating external communications external and may also conserve power.

DETAILED DESCRIPTION

Figure 1:
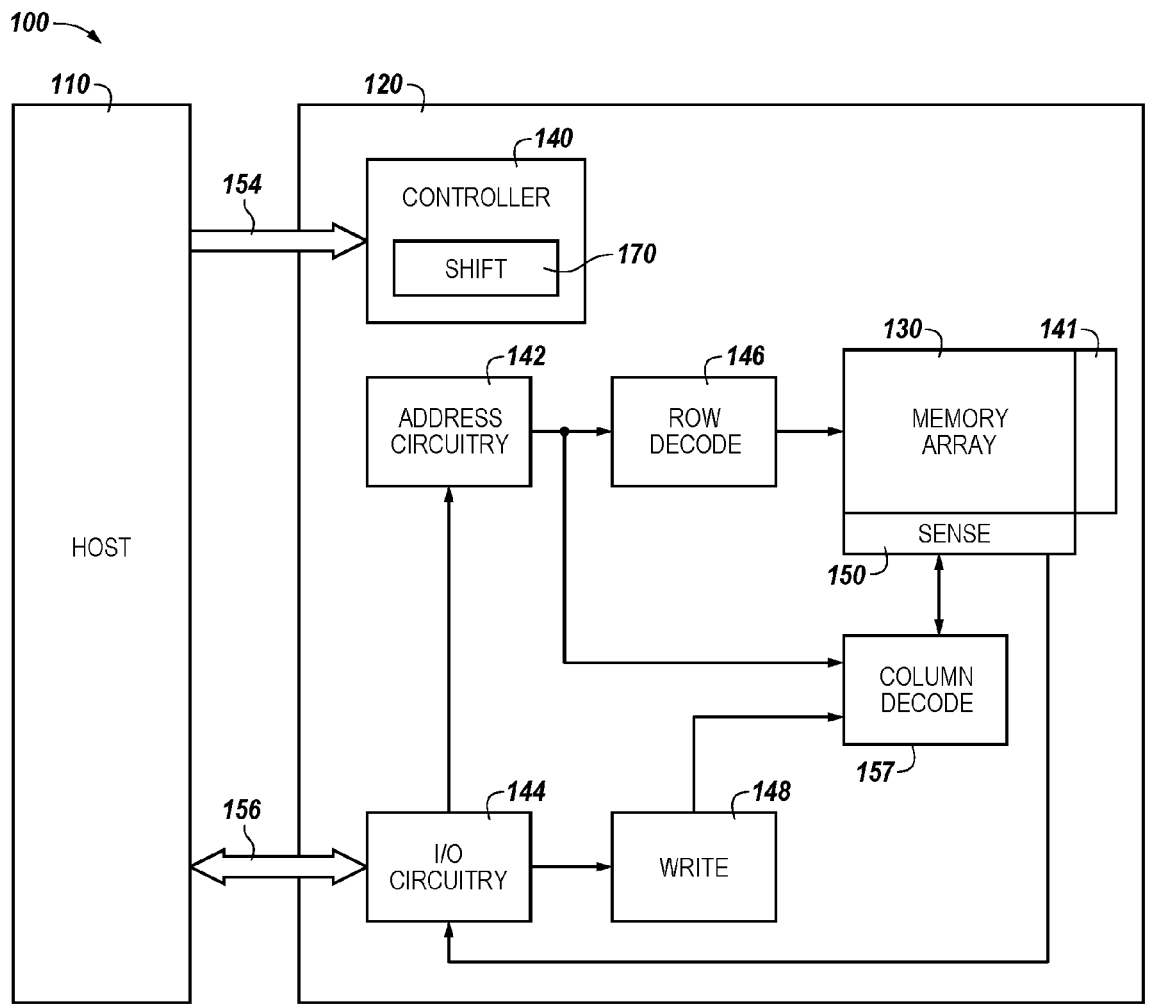
FIG. 1 is a block diagram of an apparatus in the form of an electronic system including a memory device in accordance with a number of embodiments of the present disclosure.

The present disclosure includes apparatuses and methods related to storing a data value in multiple columns of a memory array. An example apparatus comprises an array of memory cells coupled to sensing circuitry. The apparatus can include a control component configured to cause computing of a data value equal to a logical OR between the digit of a mask and a data value stored in a memory cell located in a row at a column of the array corresponding to a digit of a vector stored in the array. The control component can cause storing of the data value equal to the logical OR in the memory cell located in the row at the column of the array corresponding to the digit of the vector.

The present disclosure includes apparatus and methods that can reduce the amount of time to accumulate and store a numerical value in a particular location in an array of memory cells (e.g., as a binary number stored in a column of the array of memory cells). Accumulating a numerical value in the array of memory cells can be accomplished in approximately B row operations (where B is the number of digits in the numerical value) on each increment of the numerical value. According to embodiments of the present disclosure, increments can occur in a sequencer, which utilizes only a fraction of a total time allocated to perform a row operation, with an accumulated result subsequently being copied into one or more columns of the array of memory cells. In this scenario, at worst, accumulating a numerical value takes B row cycles. A worst case is considered to be where all data values of the sequencer register are a non-zero logic value.

A vector is an ordered collection of digits (e.g., bits, etc.). Each digit of a vector can have a data value (e.g., binary 0 or 1). The data value of a digit can be stored in a memory cell of a memory array, for example. A vector can represent a numeric value. For example, a vector can be a binary number, each digit of the vector being a bit, and the vector arranged to have a least significant bit (LSB) and a most significant bit (MSB). A vector comprising multiple digits, each digit having a data value, can be stored in a memory array with each data value being stored in a different memory cell of the memory array. The data values of the vector can be stored (e.g., arranged) in the memory array in a variety of ways.

There can be various reasons for storing a vector (e.g., binary number) in multiple columns of the memory array. A binary number may initially reside in a register outside the memory array, such as a sequencer (e.g., bank sequencer). According to various apparatus configurations, arithmetic operations in a sequencer can be much faster than those performed involving a binary number stored as data values in memory cells of the memory array. One example might be accumulating (e.g., counting) a numeric quantity that is stored as a binary number in memory cells coupled to a column. As used herein, a column of memory cells refers to memory cells coupled to one, or a complementary pair, of data sense lines to which a sensing circuitry is coupled. Columns are often thought of as being arranged in a vertical orientation, but embodiments of apparatus for implementing the methods of the present disclosure are not limited to such orientations or linear configurations (e.g., a column may be configured in a "U" or other shape).

The capability to store a vector (e.g., binary number) in multiple columns of the memory array can be used to avoid accumulating numeric quantities stored in memory cells coupled to a same column. Arithmetic operations involving vectors representing a number can be costly in terms of time to complete since each arithmetic operation can take on the order of a number of row cycles linear with respect to the number of digits in the vector. As used herein, a row cycle refers to a number of clock cycles to move a data value from a memory cell in a row and operate thereon.

Since arithmetic operations involving a number stored in the sequencer can be achieved much faster, the capability to accumulate a value in the sequencer and then subsequently store the value from the sequencer to multiple columns of the array of memory cells can be a valuable operation to improve efficiency of higher-level arithmetic operations accomplished by a processor in memory apparatus. As is shown in greater detail with respect to FIGS. 5 and 6, the processor in memory apparatus of the present disclosure can include sensing circuitry associated with sense line(s) (e.g., columns). The sensing circuitry for multiple columns can operate in parallel involving data values stored in memory cells coupled to the sense line(s). Thus, it can be advantageous to store a vector in a column of memory cells (e.g., rather than a row) such that operations involving the vector can be implemented using the sensing circuitry coupled to the column. For example, the vector may represent a number, such as a count quantity or other numeric result.

Performing logical operations, in parallel, using the sensing circuitry coupled to columns of a memory array can be employed to rapidly and efficiently implement logical and/or arithmetic operations involving a vector stored in columns of the memory array.

Thus, a number of embodiments of the present disclosure can provide improved parallelism and/or reduced power consumption in association with performing compute functions as compared to previous systems including current processor in memory (PIM) systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, delete, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of current PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 506 may reference element "06" in FIG. 5, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure.

The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as data lines or digit lines). Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over an I/O bus 156 (e.g., a data bus) through I/O circuitry 144. Address signals are received through address circuitry 142 and decoded by a row decoder 146 and a column decoder 157 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

The controller 140 can include a shift controller 170 that can control signals provided to, for instance, shift circuitry in association with performing data shifting as described further herein. For example, the shift controller 170 can control shifting data (e.g., right or left) in an array.

Examples of the sensing circuitry 150 are described further below. For instance, in a number of embodiments, the sensing circuitry 150 can comprise a number of sense amplifiers and a number of compute components, which may serve as, and be referred to herein as, an accumulator and can be used to perform logical operations (e.g., on data associated with complementary data lines).

In a number of embodiments, the sensing circuitry (e.g., 150) can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry 150. The sensing circuitry 150 can be formed on pitch with the memory cells of the array.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

Figure 2:
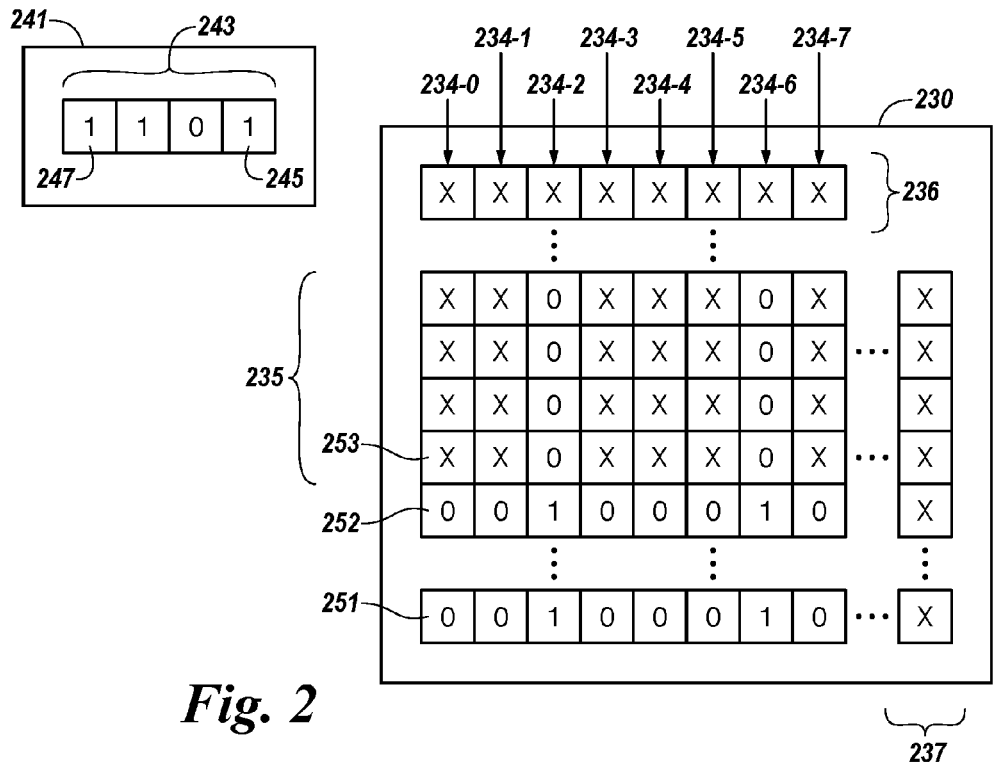
FIG. 2 illustrates a mask arranged in a memory array in accordance with a number of embodiments of the present disclosure.

FIG. 2 illustrates a mask arranged in a memory array in accordance with a number of embodiments of the present disclosure. FIG. 2 shows an array of memory cells 230. The memory cells can be arranged in the array 230 in rows (e.g., represented in a two-dimensional depiction as having a horizontal orientation) and columns (e.g., represented in a two-dimensional depiction as having a vertical orientation).

The array 230 can include a logic stripe 251, which can be a row of storage elements (e.g., latches and/or memory cells) used to track those columns to which a vector are to be stored. For example, a storage element in the logic stripe 251 can have a data value corresponding to a logic "0" in those columns that are not to have the vector stored therein, and a storage element in the logic stripe 251 can have a data value corresponding to a logic "1" in those columns that are to have the vector stored therein. A storage element of the logic stripe 251 can correspond to a particular column of the array 230. The logic stripe 251 can be at least a portion of sensing circuitry (e.g., sensing circuitry 150 shown in FIG. 1 or sensing circuitry 550 shown in FIG. 5). As such, the logic stripe 251 can comprise a number of sense amplifiers and compute components. Embodiments of the present disclosure are not so limited and correspondence between storage elements of the logic stripe 251 and columns of the array 230 can be established dynamically. For example, the vector can have origins external to the array 230 (e.g., the vector can be a register value such as a value from a register 243 of a control component 241).

According to some embodiments of the present disclosure, the vector can be stored in a plurality of columns within a subarray 235 of the array 230. The array 230 can include the subarray 235 and additional rows 236 and columns 237 not included in the subarray 235. That is, the subarray 235 can include fewer than all of the memory cells of the array 230. Although only one subarray 235 is shown in FIG. 2 for simplicity in illustrating the present disclosure, embodiments are not so limited, and the array 230 can include a plurality of different subarrays 235, as well as additional memory cells.

FIG. 2 shows the array 230 including an indicator row 252 of memory cells storing a mask (e.g., data values indicative of those columns into which the vector will be stored). The indicator row 252 can be, for example, a temporary row, or a value stored in the sensing circuitry (e.g., stored in an accumulator or sense amp of the sensing circuitry). For example, data values in storage elements of the logic stripe 251 can be copied into memory cells of indicator row 252. FIG. 2 shows a starting row 253 of the subarray 235 being located adjacent to the indicator row 252. However, embodiments of the present disclosure are not so limited and the indicator row 252 may, but need not be, located adjacent the subarray 235 and/or starting row 253. The starting row 253 can be a reference location for storing the vector. For example, the least significant digit of the vector or the most significant digit of the vector can be stored in a memory cell in the starting row 253.

FIG. 2 also shows a control component 241 that is discrete from the array 230. The control component 241 can be, for example, a sequencer. The control component 241 is shown in FIG. 1 as element 141. Although, in FIG. 1, the control component 141 is shown as being separate from controller 140, the control component 241 can be part of (e.g., integrated with) a controller such as controller 140 shown in FIG. 1. The control component 241 can include a register 243 comprising a number of storage elements (e.g., a number of latches and/or memory cells) in which data values can be stored. The storage elements of register 243 can be arranged in an order so as to have a least significant digit 245 (e.g., least significant bit) and a most significant digit 247. As such, the data values in the register 243 can represent a number (e.g., a binary number). The control component 241 can be utilized, for example, to implement counting operation and/or a result of mathematical operation(s), the register 243 storing a resulting number of such operations.

Embodiments are not limited to a particular number of rows in the subarray 235. The number of rows in the subarray may be correlated to the size of a number (e.g., binary number) in a register 243 of a sequencer 241 that is to be stored in a column (e.g., 234-2 and 234-6). A binary number (e.g., "1101") can be referred to as a B-digit value where B=4 digits to the binary value 1101.

During an operation to store a vector (e.g., register value) in a number of columns in the subarray 235, the contents of those memory cells located within the subarray 235, but not located in those columns to which the vector is to be stored, should not be disturbed. That is, it is desirable to store the vector in memory cells of certain columns within the subarray 235 without disturbing the contents of the other memory cells in the subarray 235.

As shown in FIG. 2, the vector is to be stored in columns 234-2 and 234-6, as indicated by having a data value of logic "1" stored in memory cells of indicator row 252 corresponding to those columns. Thus, according to some embodiments of the present disclosure, the data values in the memory cells in the columns of the subarray 235 to which the vector will be stored correspond to a logical "0." According to some embodiments of the present disclosure, the data values in the memory cells in the columns of the subarray 235 to which the vector will be stored can be cleared (e.g., set to store a data value corresponding to a logic "0") prior to storing the vector, as described further below.

Figure 3:
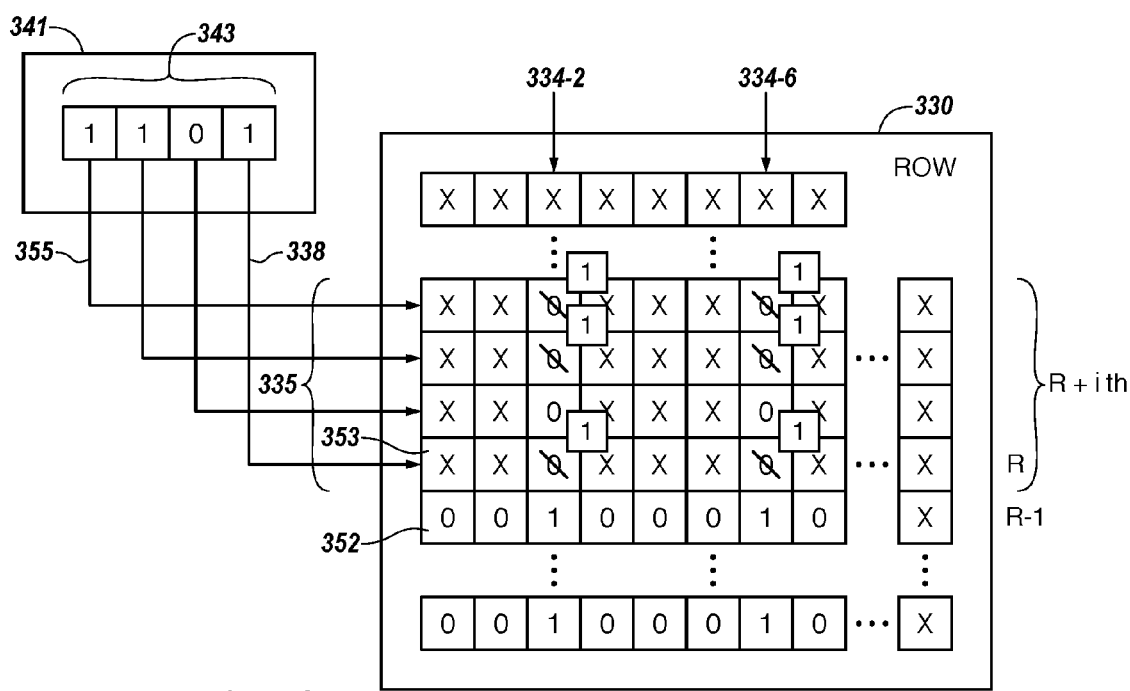
FIG. 3 illustrates storing a vector in multiple columns corresponding to a mask in accordance with a number of embodiments of the present disclosure.

FIG. 3 illustrates storing a vector in multiple columns corresponding to a mask in accordance with a number of embodiments of the present disclosure. After the memory cells in the columns of the subarray to which a vector is to be stored are cleared, FIG. 3 depicts an example method for storing the vector in multiple columns. FIG. 3 shows the binary number "1101" initially stored in the register 343 of a sequencer 341 being stored in columns of the array 330 (e.g., 334-2 and 334-6). For example, the least significant digit of the vector (e.g., 245 shown in FIG. 2) can be stored in the memory cells of a starting row 353 (e.g., row R) in each of the columns (e.g., 334-2 and 334-6) indicated to which the vector is to be stored, as shown by arrow 338. Each data value of the vector can likewise be stored in a row of the subarray 335 of array 330 in the columns indicated for storing the vector (e.g., columns 334-2 and 334-6). The row to which a particular data value is stored can be offset from the starting row by a same offset that the particular data value of the vector is offset (e.g., by an index i) from the least significant digit of the vector, which can be stored in the starting row 353 (e.g., row R). This process of successively storing data values of the vector can continue until the most significant digit (e.g., 247 shown in FIG. 2) of the vector is stored in the subarray 335, as indicated by arrow 355.

That is, the process for storing data values of the vector can start with the least significant data value of the register value being stored in the starting row R (e.g., which can be adjacent to the indicator row), and proceed in an order for each data value of the vector until the most significant digit of the register value is stored in the subarray 335 (e.g., can be stored in a memory cell of the respective column furthest away from the starting row). However, embodiments of the present disclosure are not so limited and the process can be accomplished in many variations. For example, the vector can be stored with the most significant digit in the starting row R and the least significant digit of the register value being stored in the array in a row furthest away from the starting row R. Or, the register value can be stored in the array with the most significant digit being stored first, but in a row furthest away from the indicator and/or starting row R. The least significant digit of the register value can be stored in the array last, but in the starting row R located closest to the indicator row (e.g., row R−1), etc. Where a quantity of data values comprising the register value is known, the quantity can be used to determine a total row offset between the least significant digit and the most significant digit in the column to which the register value is stored.

According to various embodiments of the present disclosure, the following procedure can be used to implement storing a vector in multiple columns of a subarray (e.g., portion of the array 330). The inputs to the procedure can be, for example, a B-digit value, V; a C-digit mask, M (where C is the number of columns in the subarray); and a row index, i, which can indicate a row where the first digit of V is to be stored. The B-digit value is an ordered collection of data values, V, which can be equivalently referred to herein as a value (e.g., register value) or vector. The value, V, can be stored in a register 343 (e.g., in a sequencer's 341 register file). The procedure described here can be used to copy the value, V, to one or more columns in the array of memory cells (e.g., to one or more columns (e.g., 334-2 and 334-6) in the subarray 335).

The following description assumes that the mask has already been generated (e.g., in the logic stripe) and is stored in the indicator row 352. The mask can be generated by various apparatus and methods, and generation of the mask is not limited to any particular apparatus or method. The mask can be stored in a row other than the rows used to store the value, V. For example, the mask can be stored in the indicator row of the array of memory cells 330 (e.g., 352 shown in FIG. 3), which is shown as being the R−1 row of the subarray for reference. Alternatively or additionally, the mask can be stored in the sensing circuitry shown in FIG. 5 (e.g., accumulator 531, sense amplifier 506) associated with each column of a subarray. In the mask, the digits corresponding to the columns to which a value, V, is to be stored are set to a particular data value (e.g., logic "1"), and the digits corresponding to the columns to which the value, V, is not to be stored are set to a different data value (e.g., logic "0"). The columns to which the value, V, is to be stored can be referred to as destination columns.

The following describes a method for storing the value, V, in the destination columns (e.g., 334-2 and 334-6 in this example) with the least significant digit being stored in the memory cells of respective columns at row R, and the most significant digit being stored in the memory cells of respective columns at row R+B−1. Digits of the value, V, will be processed beginning from the least significant digit and ending with the most significant digit, as one example. However, as previously discussed, methods and apparatus of the present disclosure can implement different digit processing orders and/or correspondence between digits of the value, V, and rows of the array of memory cells.

According to various embodiments of the present disclosure, the mask, M, is stored in the indicator row and/or the logic stripe (e.g., sensing circuitry comprising accumulators and/or sense amplifiers). According to some embodiments of the present disclosure, the data values of the memory cells in the destination columns from row R to row R+B−1 are cleared. That is, the data values of the memory cells in the destination columns from row R to row R+B−1 are set to a particular data value. The data values of the memory cells in the destination columns from row R to row R+B−1 can be set to a data value that does not cause a logical OR involving that data value to be true due to that data value. For example, the data values of the memory cells in the destination columns from row R to row R+B−1 can be set to a logical "0" such that a logical OR will not be true (e.g., a logical "1") due to the data value.

According to some embodiments, the data values of the memory cells in the destination columns from row R to row R+B−1 can be cleared without modifying (e.g., clearing) the existing data values in memory cells in the subarray in columns other than the destination columns. One method for initializing the data values of the memory cells in the destination columns from row R to row R+B−1 is to invert the mask, M, data value corresponding to each column in the subarray; storing it (e.g., in the array of memory cells or the sensing circuitry); and performing a logical AND using the inverted mask data value as one operand and the data value of a memory cell of a respective column as the other operand. This logical AND using the inverted mask data value is performed for each memory cell of a respective column from row R to row R+B−1. The result of the logical AND using the inverted mask data value is stored back to the memory cell from which the operand of the logical AND came.

For destination columns, the inverted mask data value is a logical "0" so that the result of the logical AND will always be a logical "0," which will effectively clear the data values in all the memory cells of the destination columns from row R to row R+B−1. The inverted mask data value is a logical "1" for columns of the subarray other than the destination columns, so the result of the logical AND operation will depend on the value of the second operand of the logical AND (e.g., the data value in each memory cell in columns other than the destination columns from row R to row R+B−1). The same data value as the operand data value will result from the logical AND operation. In this manner, the data values in the memory cells of the destination columns will be cleared from row R to row R+B−1, and the data values in the memory cells of the other columns will not be changed. If necessary after clearing the memory cells of the destination columns, the inverted mask data values can be re-inverted to recover the mask, M.

An index, "i," where "i" ranges from 0 to B−1 (e.g., where B is the quantity of digits in the value, V) can be used to control the iterative process described herein. After the memory cells of the destination columns are cleared, index, i, can be set to 0 corresponding to the least significant digit of the value, V, and corresponding to the starting row of the subarray (e.g., row R). For each value of the index, i, if the digit of the value, V, is a logical "0", the index can be incremented with no further operation on data values since the data value in the subarray in a destination column and the R+ith row was pre-set to a logical "0" by clearing the destination columns described above.

For each value of the index, i, if the digit of the value, V, is a logical "1", a logical OR is performed involving the data value of the mask corresponding to a particular column and the data value stored in the memory cell corresponding to the R+ith row, with the result being stored back in the memory cell corresponding to the R+ith row. This logical OR operation can be performed in the sensing circuitry corresponding to each respective column. As such, the logical OR operation is performed in parallel in the sensing circuitry for each column, including destination columns and columns other than destination columns. However, because the data value of the mask for columns other than destination columns is a logical "0," the result of the logical OR operation will depend only on the data value in the memory cell corresponding to the R+ith row. Therefore, in columns other than destination columns the same data value will be stored back to the memory cell corresponding to the R+ith row. If the data value was a logical "0" the result of the logical OR operation is also a logical "0," and if the data value was a logical "1" the result of the logical OR operation is also a logical "1."

The digit of the mask for each of the destination columns is a logical "1"; therefore, the result of the logical OR operation will always be a logical "1," which is written back to in the memory cell corresponding to the R+ith row. Recall, performing the logical OR operation only occurs when the ith digit of the value, V, is a logical "1," so the effect is to write a logical "1" to memory cells in the destination columns to the memory cell corresponding to the R+ith row, and to write back the same data values to the memory cell corresponding to the R+ith row in other than destination columns. According to various embodiments, the data value of the mask can be loaded into the accumulator 531 of the sensing circuitry 550 (e.g., in Row X or Y shown in FIG. 5), and the data value of the memory cell corresponding to the R+ith row can be loaded into the sense amplifier of the sensing circuitry, with the logical OR operation being performed within the sensing circuitry for each column.

After the logical OR operation is performed and the result written back to the memory cell corresponding to the R+ith row, the index can be incremented and the analysis repeated iteratively for all the digits of the value, V, through the most significant digit of the value, V (e.g., i=B−1), at which the iterative process can be terminated.

As mentioned above, the only activity that is performed when a digit of the value, V, is a logical "0" is to increment the index (accomplished by a shift and write back to the register file), which can be accomplished in at most two clock cycles. By way of example and not by way of limitation, in some DRAM processes, two clock cycles have a duration of approximately 8 nS. Likewise when a digit of the value, V, is a logical "1," the logical OR operation between a data value stored in a memory cell corresponding to a row and the data value of the mask residing in the sensing circuitry can be accomplished in approximately 60 nS. In a worst case in this scenario, all the digits of the value, V, are a logical "1" value and the logical OR operation could be performed with each iteration of the index, i. However, since these logical OR operations are performed in parallel for each column, the time to write the entire value, V, to any number of columns (e.g., 1 or all in a subarray) is still linear with respect to the width of the value, V (e.g., linear with respect to B).

Figure 4:
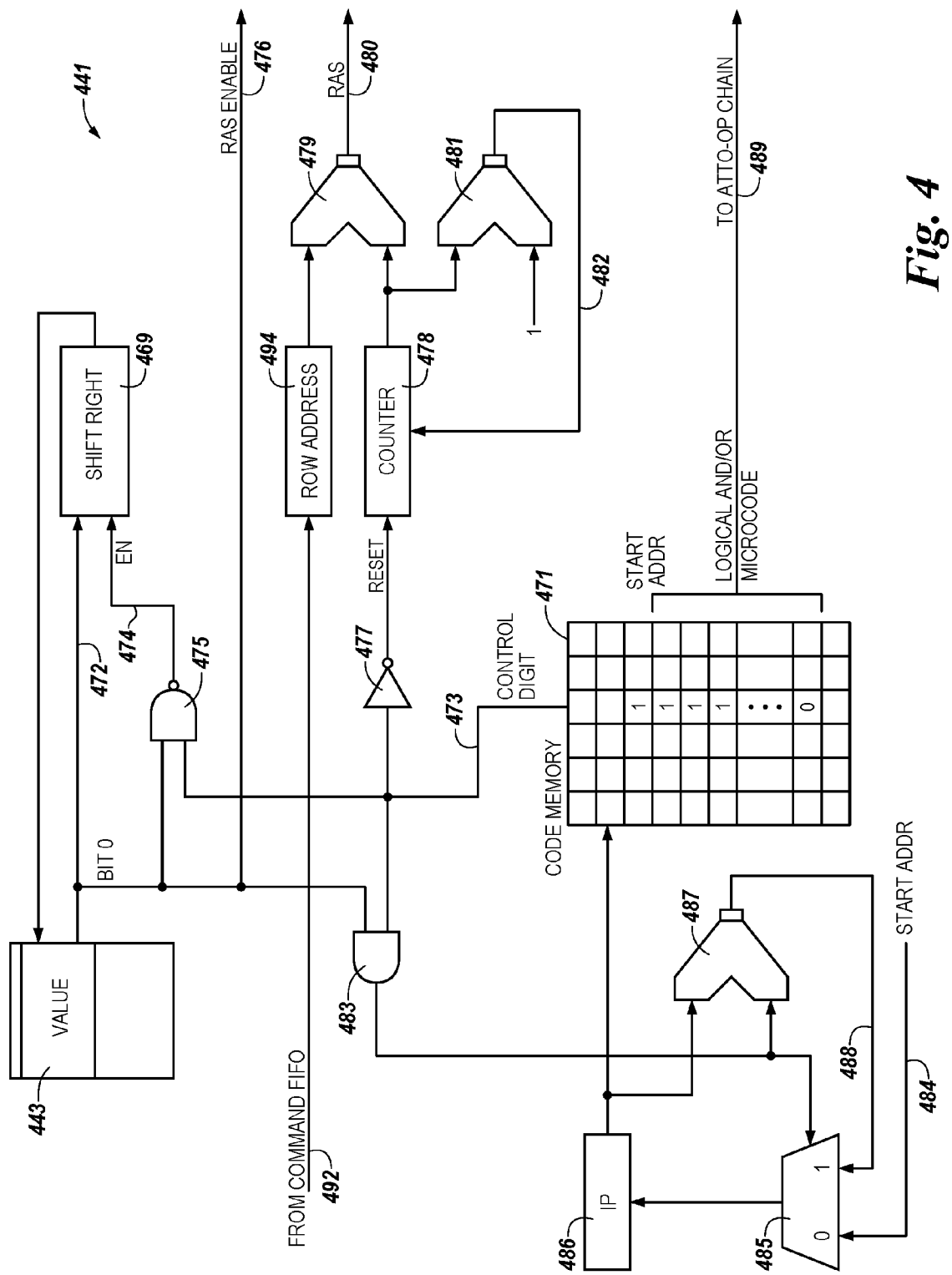
FIG. 4 illustrates a circuit for storing a data value in multiple columns of a memory array in accordance with a number of embodiments of the present disclosure.

FIG. 4 illustrates a circuit for storing a data value in multiple columns of a memory array in accordance with a number of embodiments of the present disclosure. FIG. 4 shows one example embodiment of circuitry associated with architecture of a sequencer 441 that can implement the above-described methodology. The sequencer 441 can be located, for example, in the periphery of the array of memory cells on the same chip. The sequencer 441 shown in FIG. 4 includes the register 443, which can be similar to register 243 shown in FIGS. 2 and 343 shown in FIG. 3, and which can store one or more data values corresponding to a number.

The sequencer can include a shift control 469, (e.g., shift right, shift left) the output of which can be configured to reference (e.g., select) a different data value in the register 443. The shift control 469 can have several inputs including a first input 472 that is asserted whenever a data value of a selected digit in the register 443 has a logic "0" value. As discussed above, no further action is performed (e.g., a logical OR operation is not performed in the sensing circuitry) when the data value of a digit of the value, V, is a logic "0" except the shift control is activated to select a next digit of the value, V. The shift control 469 can have a second input 474, "Enable," that is asserted by an output from NAND 475. The second input 474 is asserted through NAND gate 475 whenever the data value of a selected digit in the register 443 is not a logic "0' (e.g., is a logic "1") and a control digit 473 from the control code memory 471 is also not a logic "0" (indicative that the logical OR operation is complete and result is stored back to the memory cell at the appropriate row, as previously described above).

The sequencer 441 shown in FIG. 4 includes a Row Address Select (RAS) Enable output 476 that is configured to fire a row when the data value of a selected digit (which in FIG. 4 is the LSB) in the register 443 has a logic "1' value. The sequencer 441 shown in FIG. 4 also includes a Row Address Select (RAS) output 480, which selects a particular row of the array of memory cells. The RAS output 480 can be the output of gate 479, which adds the row address 494 and counter 478 values.

The RAS output 480 can be a row address determined from a reference row address (e.g., R) and an offset. Inputs to gate 479 include a row address (e.g., the reference row address) from row address 494, which can be the address of row R, which is loaded from the command FIFO 492 (i.e., first in first out queue). The row offset can be stored in counter 478, and can function as the index, i, previously discussed above. The counter 478 can be incremented via an output 482 of gate 481, which can combine the present counter value plus 1. The counter can be reset (e.g., back to 0 or 1 depending on the reference row address) via invert gate 477 from the control digit 473 (indicative that the logical OR operation is complete and result is stored back to the memory cell at the appropriate row, as previously described above).

Control code memory 471 can store instructions (e.g., logical and/or microcode) that when executed can control operation of the sequencer 441 and/or the sensing circuitry, among others. An instruction pointer 486 can select a particular portion of the instructions stored in the control code memory 471. The instruction pointer 486 can be selected via multiplexer 485, which can have inputs including a starting address 484 and an output 488 of gate 487. Gate 487 can be configured to combine the present instruction pointer value from instruction pointer 486 and the output of AND gate 483, which can be either a logical "1" (to increment the instruction pointer value) or a logical "0" (to maintain the present instruction pointer value). The output of AND gate 483 is a logical "1" whenever the data value of a selected digit in the register 443 has a logic "1" value (for which the logical OR operation and storing result is to be performed) and the control digit 473 from the control code memory 471 is also a logic "1" (indicative that the logical OR and storing operations are not yet complete). The code memory 471 can have an output 489, which can provide an address (e.g., starting address) of logical and/or microcode to the ATTO operation chain, for example, to control performance of the logical OR operation and storing the result back to the memory cell of the appropriate row (e.g., from which an operand of the logical OR operation was obtained).

Figure 5:
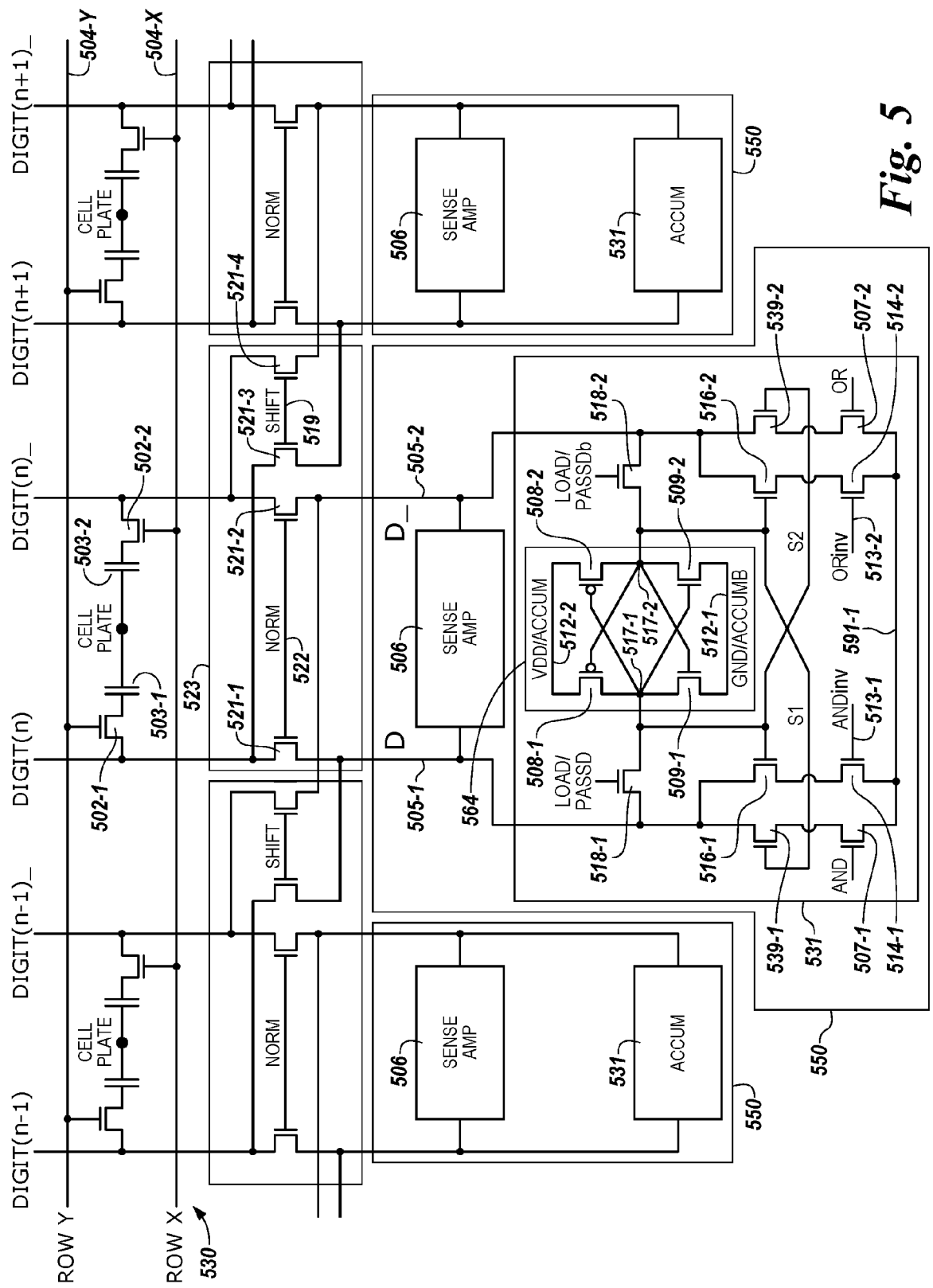
FIG. 5 is a schematic diagram illustrating sensing circuitry in accordance with a number of embodiments of the present disclosure.

FIG. 5 is a schematic diagram illustrating sensing circuitry in accordance with a number of embodiments of the present disclosure. A memory cell comprises a storage element (e.g., capacitor) and an access device (e.g., transistor). For instance, transistor 502-1 and capacitor 503-1 comprises a memory cell, and transistor 502-2 and capacitor 503-2 comprises a memory cell, etc. In this example, the memory array 530 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 530 are arranged in rows coupled by word lines 504-X (Row X), 504-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 505-1 (D) and 505-2 (D_) respectively. Although only three pair of complementary data lines are shown in FIG. 5, embodiments of the present disclosure are not so limited, and an array of memory cells can include additional columns of memory cells and/or data lines (e.g., 4,096, 8,192, 6,384, etc.).

Memory cells can be coupled to different data lines and/or word lines. For example, a first source/drain region of a transistor 502-1 can be coupled to data line 505-1 (D), a second source/drain region of transistor 502-1 can be coupled to capacitor 503-1, and a gate of a transistor 502-1 can be coupled to word line 504-Y. A first source/drain region of a transistor 502-2 can be coupled to data line 505-2 (D_), a second source/drain region of transistor 502-2 can be coupled to capacitor 503-2, and a gate of a transistor 502-2 can be coupled to word line 504-X. The cell plate, as shown in FIG. 5, can be coupled to each of capacitors 503-1 and 503-2. The cell plate can be a common node to which a reference voltage (e.g., ground) can be applied in various memory array configurations.

The memory array 530 is coupled to sensing circuitry 550 in accordance with a number of embodiments of the present disclosure. In this example, the sensing circuitry 550 comprises a sense amplifier 506 and a compute component 531 corresponding to respective columns of memory cells (e.g., coupled to respective pairs of complementary data lines). The sense amplifier 506 can comprise a cross coupled latch, which can be referred to herein as a primary latch. The sense amplifier 506 can be configured, for example, as described with respect to FIG. 6.

In the example illustrated in FIG. 5, the circuitry corresponding to compute component 531 comprises a static latch 564 and an additional ten transistors that implement, among other things, a dynamic latch. The dynamic latch and/or static latch of the compute component 531 can be collectively referred to herein as a secondary latch, which can serve as an accumulator. As such, the compute component 531 can operate as and/or be referred to herein as an accumulator. The compute component 531 can be coupled to each of the data lines D 505-1 and D_ 505-2 as shown in FIG. 5. However, embodiments are not limited to this example. The transistors of compute component 531 can all be n-channel transistors (e.g., NMOS transistors), for example.

In this example, data line D 505-1 can be coupled to a first source/drain region of transistors 516-1 and 539-1, as well as to a first source/drain region of load/pass transistor 518-1. Data line D_ 505-2 can be coupled to a first source/drain region of transistors 516-2 and 539-2, as well as to a first source/drain region of load/pass transistor 518-2.

The gates of load/pass transistor 518-1 and 518-2 can be commonly coupled to a LOAD control signal, or respectively coupled to a PASSD/PASSDB control signal, as discussed further below. A second source/drain region of load/pass transistor 518-1 can be directly coupled to the gates of transistors 516-1 and 539-2. A second source/drain region of load/pass transistor 518-2 can be directly coupled to the gates of transistors 516-2 and 539-1.

A second source/drain region of transistor 516-1 can be directly coupled to a first source/drain region of pull-down transistor 514-1. A second source/drain region of transistor 539-1 can be directly coupled to a first source/drain region of pull-down transistor 507-1. A second source/drain region of transistor 516-2 can be directly coupled to a first source/drain region of pull-down transistor 514-2. A second source/drain region of transistor 539-2 can be directly coupled to a first source/drain region of pull-down transistor 507-2. A second source/drain region of each of pull-down transistors 507-1, 507-2, 514-1, and 514-2 can be commonly coupled together to a reference voltage line 591-1 (e.g., ground (GND)). A gate of pull-down transistor 507-1 can be coupled to an AND control signal line, a gate of pull-down transistor 514-1 can be coupled to an ANDinv control signal line 513-1, a gate of pull-down transistor 514-2 can be coupled to an ORinv control signal line 513-2, and a gate of pull-down transistor 507-2 can be coupled to an OR control signal line.

The gate of transistor 539-1 can be referred to as node S1, and the gate of transistor 539-2 can be referred to as node S2. The circuit shown in FIG. 5 stores accumulator data dynamically on nodes S1 and S2. Activating the LOAD control signal causes load/pass transistors 518-1 and 518-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 5 is not contingent on the LOAD control signal being elevated to a voltage greater than $V_{DD}$.

The configuration of compute component 531 shown in FIG. 5 has the benefit of balancing the sense amplifier for functionality when the pull-down transistors 507-1, 507-2, 514-1, and 514-2 are conducting before the sense amplifier 506 is fired (e.g., during pre-seeding of the sense amplifier 506). As used herein, firing the sense amplifier 506 refers to enabling the sense amplifier 506 to set the primary latch and subsequently disabling the sense amplifier 506 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 516-1 (having a gate coupled to S2 of the dynamic latch) in series with transistor 514-1 (having a gate coupled to an ANDinv control signal line 513-1) can be operated to pull-down data line 505-1 (D), and transistor 516-2 (having a gate coupled to S1 of the dynamic latch) in series with transistor 514-2 (having a gate coupled to an ANDinv control signal line 513-2) can be operated to pull-down data line 505-2 (D_).

The latch 564 can be controllably enabled by coupling to an active negative control signal line 512-1 (ACCUMB) and an active positive control signal line 512-2 (ACCUM) rather than be configured to be continuously enabled by coupling to ground and $V_{DD}$. In various embodiments, load/pass transistors 508-1 and 508-2 can each having a gate coupled to one of a LOAD control signal or a PASSD/PASSDB control signal.

According to some embodiments, the gates of load/pass transistors 518-1 and 518-2 can be commonly coupled to a LOAD control signal. In the configuration where the gates of load/pass transistors 518-1 and 518-2 are commonly coupled to the LOAD control signal, transistors 518-1 and 518-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 5 is not contingent on the LOAD control signal being elevated to a voltage greater than $V_{DD}$.

According to some embodiments, the gate of load/pass transistor 518-1 can be coupled to a PASSD control signal, and the gate of load/pass transistor 518-2 can be coupled to a PASSDb control signal. In the configuration where the gates of transistors 518-1 and 518-2 are respectively coupled to one of the PASSD and PASSDb control signals, transistors 518-1 and 518-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 523, as shown in FIG. 5). According to some embodiments, load/pass transistors 518-1 and 518-2 can be configured to accommodate the heavier loading corresponding to a pass transistor but be coupled and operated as a load transistor. Load/pass transistors 518-1 and 518-2 configured as pass transistors can also be utilized as load transistors. However, load/pass transistors 518-1 and 518-2 configured as load transistors may not be capable of being utilized as pass transistors.

In a number of embodiments, the compute component 531, including the latch 564, can comprise a number of transistors formed on pitch with the transistors of the corresponding memory cells of an array (e.g., array 530 shown in FIG. 5) to which they are coupled, which may conform to a particular feature size (e.g., $4F^2$, $6F^2$, etc.). According to various embodiments, latch 564 includes four transistors 508-1, 508-2, 509-1, and 509-2 coupled to a pair of complementary data lines D 505-1 and D_505-2 through load/pass transistors 518-1 and 518-2. However, embodiments are not limited to this configuration. The latch 564 can be a cross coupled latch (e.g., gates of a pair of transistors, such as n-channel transistors (e.g., NMOS transistors) 509-1 and 509-2 are cross coupled with the gates of another pair of transistors, such as p-channel transistors (e.g., PMOS transistors) 508-1 and 508-2). As described further herein, the cross coupled latch 564 can be referred to as a static latch.

The voltages or currents on the respective data lines D and D_ can be provided to the respective latch inputs 517-1 and 517-2 of the cross coupled latch 564 (e.g., the input of the secondary latch). In this example, the latch input 517-1 is coupled to a first source/drain region of transistors 508-1 and 509-1 as well as to the gates of transistors 508-2 and 509-2. Similarly, the latch input 517-2 can be coupled to a first source/drain region of transistors 508-2 and 509-2 as well as to the gates of transistors 508-1 and 509-1.

Figure 6:
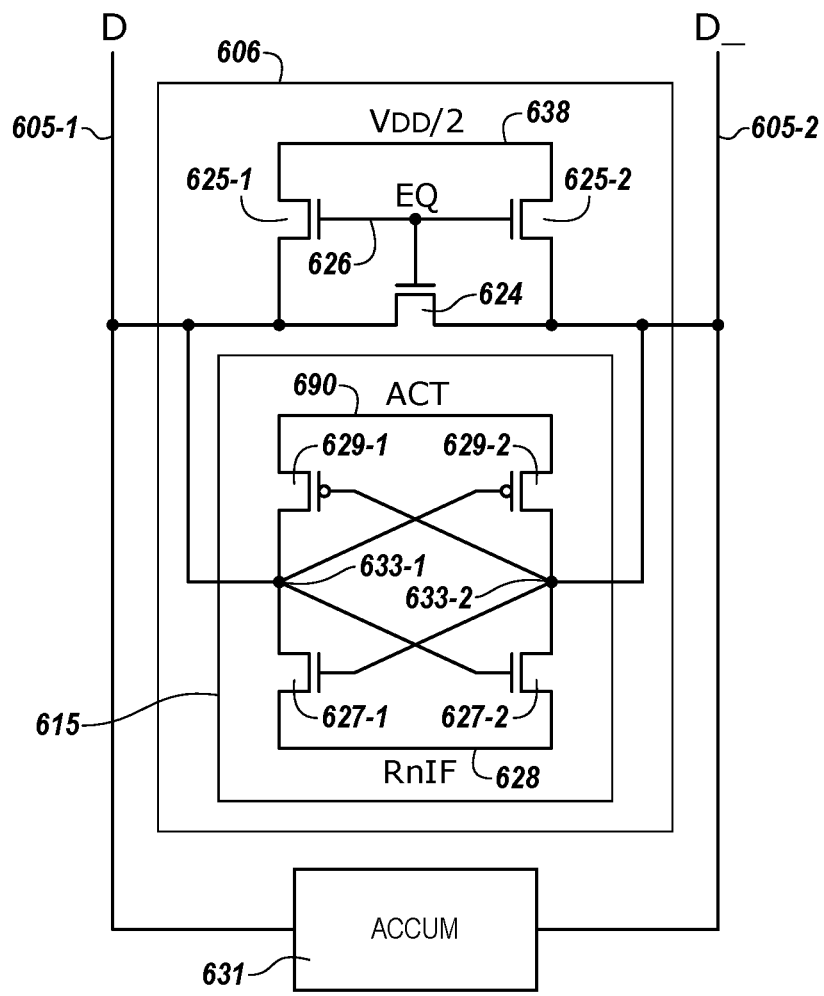
FIG. 6 is a schematic diagram illustrating a portion of sensing circuitry in accordance with a number of embodiments of the present disclosure.

In this example, a second source/drain region of transistor 509-1 and 509-2 is commonly coupled to a negative control signal line 512-1 (e.g., ground (GND) or ACCUMB control signal similar to control signal RnIF shown in FIG. 6 with respect to the primary latch). A second source/drain region of transistors 508-1 and 508-2 is commonly coupled to a positive control signal line 512-2 (e.g., $V_{DD}$ or ACCUM control signal similar to control signal ACT shown in FIG. 6 with respect to the primary latch). The positive control signal 512-2 can provide a supply voltage (e.g., $V_{DD}$) and the negative control signal 512-1 can be a reference voltage (e.g., ground) to enable the cross coupled latch 564. According to some embodiments, the second source/drain region of transistors 508-1 and 508-2 are commonly coupled directly to the supply voltage (e.g., $V_{DD}$), and the second source/drain region of transistor 509-1 and 509-2 are commonly coupled directly to the reference voltage (e.g., ground) so as to continuously enable latch 564.

The enabled cross coupled latch 564 operates to amplify a differential voltage between latch input 517-1 (e.g., first common node) and latch input 517-2 (e.g., second common node) such that latch input 517-1 is driven to either the activated positive control signal voltage (e.g., $V_{DD}$) or the activated negative control signal voltage (e.g., ground), and latch input 517-2 is driven to the other of the activated positive control signal voltage (e.g., $V_{DD}$) or the activated negative control signal voltage (e.g., ground).

FIG. 6 is a schematic diagram illustrating a portion of sensing circuitry in accordance with a number of embodiments of the present disclosure. According to various embodiments, sense amplifier 606 (e.g., corresponding to sense amplifier 506 shown in FIG. 5) can comprise a cross coupled latch. However, embodiments of the sense amplifier 606 are not limited to a cross coupled latch. As an example, the sense amplifier 606 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 606) can comprise a number of transistors formed on pitch with the transistors of the corresponding compute component 631 and/or the memory cells of an array (e.g., 530 shown in FIG. 5) to which they are coupled, which may conform to a particular feature size (e.g., $4F^2$, $6F^2$, etc.). The sense amplifier 606 comprises a latch 615 including four transistors coupled to a pair of complementary data lines D 605-1 and D_ 605-2. The latch 615 can be a cross coupled latch (e.g., gates of a pair of transistors, such as n-channel transistors (e.g., NMOS transistors) 627-1 and 627-2 are cross coupled with the gates of another pair of transistors, such as p-channel transistors (e.g., PMOS transistors) 629-1 and 629-2). As described further herein, the latch 615 comprising transistors 627-1, 627-2, 629-1, and 629-2 can be referred to as a primary latch. However, embodiments are not limited to this example.

The voltages or currents on the respective data lines D and D_ can be provided to the respective latch inputs 633-1 and 633-2 of the cross coupled latch 615 (e.g., the input of the secondary latch). In this example, the latch input 633-1 is coupled to a first source/drain region of transistors 627-1 and 629-1 as well as to the gates of transistors 627-2 and 629-2. Similarly, the latch input 633-2 can be coupled to a first source/drain region of transistors 627-2 and 629-2 as well as to the gates of transistors 627-1 and 629-1. The compute component 633 (e.g., serving as an accumulator) can be coupled to latch inputs 633-1 and 633-2 of the cross coupled latch 615 as shown; however, embodiments are not limited to the example shown in FIG. 6.

In this example, a second source/drain region of transistor 627-1 and 627-2 is commonly coupled to an active negative control signal 628 (RnIF). A second source/drain region of transistors 629-1 and 629-2 is commonly coupled to an active positive control signal 690 (ACT). The ACT signal 690 can be a supply voltage (e.g., $V_{DD}$) and the RnIF signal can be a reference voltage (e.g., ground). Activating signals 628 and 690 enables the cross coupled latch 615.

The enabled cross coupled latch 615 operates to amplify a differential voltage between latch input 633-1 (e.g., first common node) and latch input 633-2 (e.g., second common node) such that latch input 633-1 is driven to one of the ACT signal voltage and the RnIF signal voltage (e.g., to one of $V_{DD}$ and ground), and latch input 633-2 is driven to the other of the ACT signal voltage and the RnIF signal voltage.

The sense amplifier 606 can also include circuitry configured to equilibrate the data lines D and D_ (e.g., in association with preparing the sense amplifier for a sensing operation). In this example, the equilibration circuitry comprises a transistor 624 having a first source/drain region coupled to a first source/drain region of transistor 625-1 and data line D 605-1. A second source/drain region of transistor 624 can be coupled to a first source/drain region of transistor 625-2 and data line D_ 605-2. A gate of transistor 624 can be coupled to gates of transistors 625-1 and 625-2.

The second source drain regions of transistors 625-1 and 625-2 are coupled to an equilibration voltage 638 (e.g., $V_{DD}/2$), which can be equal to $V_{DD}/2$, where $V_{DD}$ is a supply voltage associated with the array. The gates of transistors 624, 625-1, and 625-2 can be coupled to control signal 625 (EQ). As such, activating EQ enables the transistors 624, 625-1, and 625-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., serving as an accumulator).

As shown in FIG. 5, the sense amplifier 506 and the compute component 531 can be coupled to the array 530 via shift circuitry 523. In this example, the shift circuitry 523 comprises a pair of isolation devices (e.g., isolation transistors 521-1 and 521-2) coupled to data lines 505-1 (D) and 505-2 (D_), respectively). The isolation transistors 521-1 and 521-2 are coupled to a control signal 522 (NORM) that, when activated, enables (e.g., turns on) the isolation transistors 521-1 and 521-2 to couple the corresponding sense amplifier 506 and compute component 531 to a corresponding column of memory cells (e.g., to a corresponding pair of complementary data lines 505-1 (D) and 505-2 (D_)). According to various embodiments, conduction of isolation transistors 521-1 and 521-2 can be referred to as a "normal" configuration of the shift circuitry 523.

In the example illustrated in FIG. 5, the shift circuitry 523 includes another (e.g., a second) pair of isolation devices (e.g., isolation transistors 521-3 and 521-4) coupled to a complementary control signal 519 (SHIFT), which can be activated, for example, when NORM is deactivated. The isolation transistors 521-3 and 521-4 can be operated (e.g., via control signal 519) such that a particular sense amplifier 506 and compute component 531 are coupled to a different pair of complementary data lines (e.g., a pair of complementary data lines different than the pair of complementary data lines to which isolation transistors 521-1 and 521-2 couple the particular sense amplifier 506 and compute component 531), or can couple a particular sense amplifier 506 and compute component 531 to another memory array (and isolate the particular sense amplifier 506 and compute component 531 from a first memory array). According to various embodiments, the shift circuitry 523 can be arranged as a portion of (e.g., within) the sense amplifier 506, for instance.

Although the shift circuitry 523 shown in FIG. 5 includes isolation transistors 521-1 and 521-2 used to couple particular sensing circuitry 550 (e.g., a particular sense amplifier 506 and corresponding compute component 531) to a particular pair of complementary data lines 505-1 (D) and 505-2 (D_) (e.g., DIGIT(n) and DIGIT(n)_) and isolation transistors 521-3 and 521-4 are arranged to couple the particular sensing circuitry 550 to an adjacent pair of complementary data lines in one particular direction (e.g., adjacent data lines DIGIT(n+1) and DIGIT(n+1)_ shown to the right in FIG. 5), embodiments of the present disclosure are not so limited. For instance, shift circuitry can include isolation transistors 521-1 and 521-2 used to couple particular sensing circuitry to a particular pair of complementary data lines (e.g., DIGIT(n) and DIGIT(n)_ and isolation transistors 521-3 and 521-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 5).

Embodiments of the present disclosure are not limited to the configuration of shift circuitry 523 shown in FIG. 5. In a number of embodiments, shift circuitry 523 such as that shown in FIG. 5 can be operated (e.g., in conjunction with sense amplifiers 506 and compute components 531) in association with performing compute functions such as adding and subtracting functions without transferring data out of the sensing circuitry 550 via an I/O line (e.g., local I/O line (IO/IO_)), for instance.

Although not shown in FIG. 5, each column of memory cells can be coupled to a column decode line that can be enabled to transfer, via local I/O line, a data value from a corresponding sense amplifier 506 and/or compute component 531 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 523 can be operated in conjunction with sense amplifiers 506 and compute components 531 to perform compute functions such as adding and subtracting functions without transferring data to a control component external to the array, for instance.

The sensing circuitry 550 can be operated in several modes to perform logical operations, including a first mode in which a result of the logical operation is initially stored in the compute component 531, and a second mode in which a result of the logical operation is initially stored in the sense amplifier 506. Operation of the sensing circuitry 550 in the first mode is described in association with the timing diagrams shown in FIGS. 9-12 (with the dynamic latch of the compute component 531 operating together with the state static latch 564 of the compute component 531). Operation of the sensing circuitry 550 in the second mode is described below with respect to FIGS. 7 and 8. Additionally with respect to the second operating mode, sensing circuitry 550 can be operated in both pre-sensing (e.g., sense amps fired before logical operation control signal active) and post-sensing (e.g., sense amps fired after logical operation control signal active) modes with a result of a logical operation being initially stored in the sense amplifier 506.

As described further below, the sense amplifier 506 can, in conjunction with the compute component 531, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The functionality of the sensing circuitry 550 of FIG. 5 is described below and summarized in Table 2 below with respect to performing logical operations and initially storing a result in the sense amplifier 506. Initially storing the result of a particular logical operation in the primary latch of sense amplifier 506 can provide improved versatility as compared to previous approaches in which the result may initially reside in a secondary latch (e.g., serving as an accumulator) of a compute component 531, and then be subsequently transferred to the sense amplifier 506, for instance.

TABLE 2

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 506 (e.g., without having to perform an additional operation to move the result from the compute component 531 (e.g., serving as an accumulator) to the sense amplifier 506) is advantageous because, for instance, the result can be written to a row (of the array of memory cells) or back into the accumulator without performing a precharge cycle (e.g., on the complementary data lines 505-1 (D) and/or 505-2 (D_).

Figure 7:
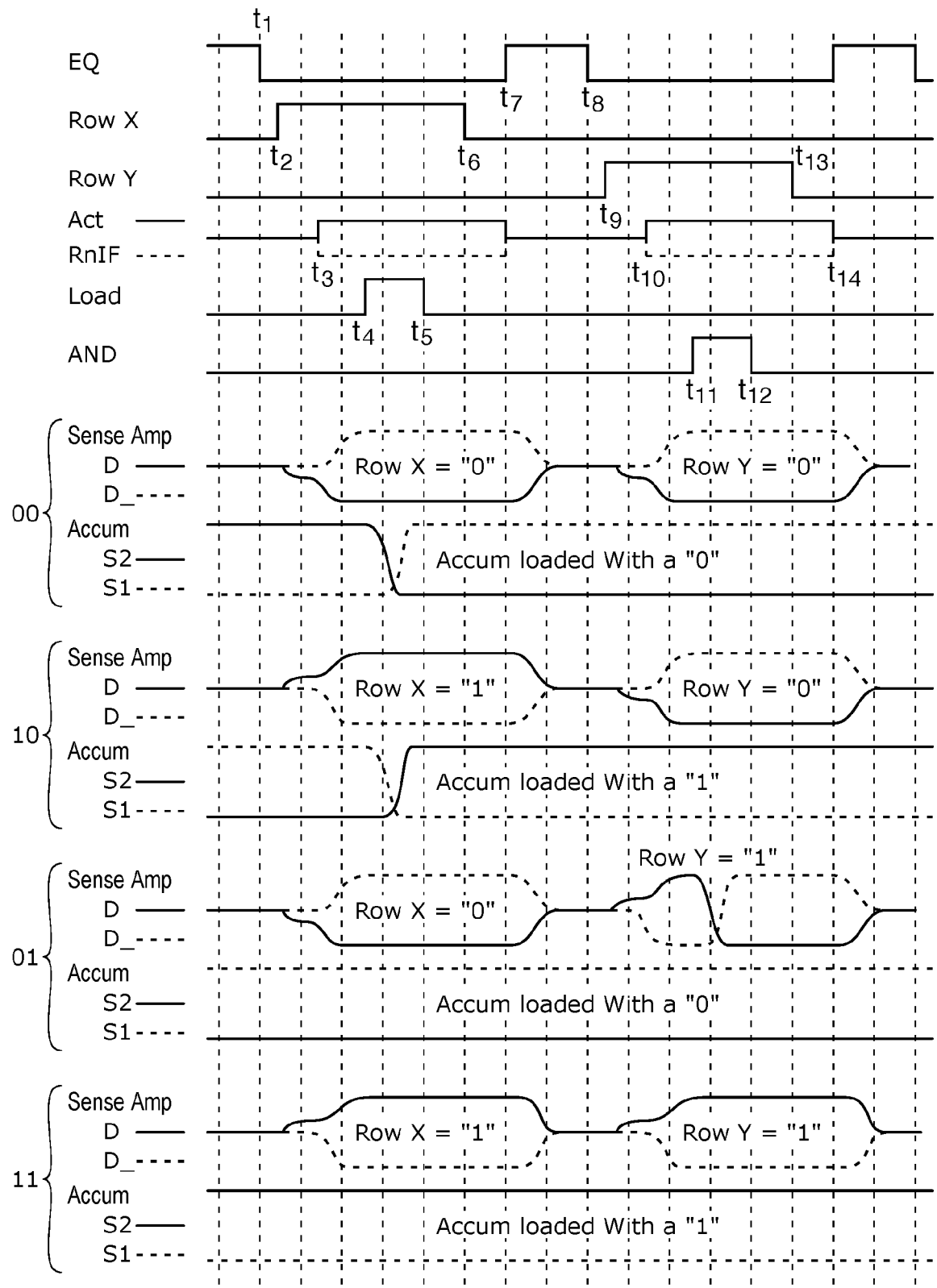
FIG. 7 illustrates a timing diagram associated with performing a number of logical operations using sensing circuitry in accordance with a number of embodiments of the present disclosure.

FIG. 7 illustrates a timing diagram associated with performing a number of logical operations using sensing circuitry in accordance with a number of embodiments of the present disclosure. FIG. 7 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 7 illustrates a number of control signals associated with operating sensing circuitry (e.g., 550) to perform the AND logical operation. "EQ" corresponds to an equilibrate signal applied to the sense amplifier 506, "ROW X" corresponds to an enabling signal applied to access line 504-X, "ROW Y" corresponds to an enabling signal applied to access line 504-Y, "Act" and "RnIF" correspond to a respective active positive and negative control signal applied to the sense amplifier 506, "LOAD" corresponds to a load control signal (e.g., LOAD/PASSD and LOAD/PASSDb shown in FIG. 5), and "AND" corresponds to the AND control signal shown in FIG. 5. FIG. 7 also illustrates the waveform diagrams showing the signals (e.g., voltage signals) on the digit lines D and D_ corresponding to sense amplifier 506 and on the nodes S1 and S2 corresponding to the compute component 531 (e.g., serving as an accumulator) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 5.

An example of pseudo code associated with loading (e.g., copying) a first data value stored in a cell coupled to row 504-X into the accumulator can be summarized as follows:

Copy Row X into the Accumulator:
    Deactivate EQ
    Open Row X
    Fire Sense Amps (after which Row X data resides in the sense amps)
    Activate LOAD (sense amplifier data (Row X) is transferred to nodes
       S1 and S2 of the Accumulator and resides there dynamically)
    Deactivate LOAD

```
Close Row X
Precharge
```

In the pseudo code above, "Deactivate EQ" indicates that an equilibration signal (EQ signal shown in FIG. 7) corresponding to the sense amplifier 506 is disabled at $t_1$ as shown in FIG. 7 (e.g., such that the complementary data lines (e.g., 505-1 (D) and 505-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 7. When the voltage signal applied to ROW X reaches the threshold voltage (Vt) of the access transistor (e.g., 502-2) corresponding to the selected cell, the access transistor turns on and couples the data line (e.g., 505-2 (D_)) to the selected cell (e.g., to capacitor 503-2) which creates a differential voltage signal between the data lines.

After Row X is enabled in the pseudo code above, "Fire Sense Amps" indicates that the sense amplifier 506 is enabled to set the primary latch and subsequently disabled. For example, as shown at $t_3$ in FIG. 7, the ACT positive control signal (e.g., 690 shown in FIG. 6) goes high and the RnIF negative control signal (e.g., 628 shown in FIG. 6) goes low, which amplifies the differential signal between 505-1 (D) and D_505-2, resulting in a voltage (e.g., $V_{DD}$) corresponding to a logic 1 or a voltage (e.g., GND) corresponding to a logic 0 being on data line 505-1 (D) (and the voltage corresponding to the other logic state being on complementary data line 505-2 (D_)). The sensed data value is stored in the primary latch of sense amplifier 506. The primary energy consumption occurs in charging the data lines (e.g., 505-1 (D) or 505-2 (D_)) from the equilibration voltage $V_{DD}/2$ to the rail voltage $V_{DD}$.

The four sets of possible sense amplifier and accumulator signals illustrated in FIG. 7 (e.g., one for each combination of Row X and Row Y data values) shows the behavior of signals on data lines D and D_. The Row X data value is stored in the primary latch of the sense amp. It should be noted that FIG. 5 shows that the memory cell including storage element 502-2, corresponding to Row X, is coupled to the complementary data line D_, while the memory cell including storage element 502-1, corresponding to Row Y, is coupled to data line D. However, as can be seen in FIG. 5, the charge stored in memory cell 502-2 (corresponding to Row X) corresponding to a "0" data value causes the voltage on data line D_ (to which memory cell 502-2 is coupled) to go high and the charge stored in memory cell 502-2 corresponding to a "1" data value causes the voltage on data line D_ to go low, which is opposite correspondence between data states and charge stored in memory cell 502-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 7, causing load/pass transistors 518-1 and 518-2 to conduct. In this manner, activating the LOAD control signal enables the secondary latch in the accumulator of the compute component 531. The sensed data value stored in the sense amplifier 506 is transferred (e.g., copied) to the secondary latch. As shown for each of the four sets of possible sense amplifier and accumulator signals illustrated in FIG. 7, the behavior at inputs of the secondary latch of the accumulator indicates the secondary latch is loaded with the Row X data value. As shown in FIG. 7, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 505-1 (D) and 505-2 (D_), in the pseudo code above, "Deactivate LOAD" indicates that the LOAD control signal goes back low as shown at $t_5$ in FIG. 7 to cause the load/pass transistors 518-1 and 518-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 7, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 7 by the EQ signal going high at $t_7$. As shown in each of the four sets of possible sense amplifier and accumulator signals illustrated in FIG. 7 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 506 and the secondary latch of the compute component 531) and the second data value (stored in a memory cell 502-1 coupled to Row Y 504-Y) includes performing particular steps which depend on the whether an AND or an OR is to be performed. Examples of pseudo code associated with "ANDing" and "ORing" the data value residing in the accumulator (e.g., the first data value stored in the memory cell 502-2 coupled to Row X 504-X) and the second data value (e.g., the data value stored in the memory cell 502-1 coupled to Row Y 504-Y) are summarized below. Example pseudo code associated with "ANDing" the data values can include:

```
Deactivate EQ
Open Row Y
Fire Sense Amps (after which Row Y data resides in the sense amps)
Close Row Y
    The result of the logic operation, in the next operation, will be placed
        on the sense amp, which will overwrite any row that is active.
    Even when Row Y is closed, the sense amplifier still contains the
        Row Y data value.
Activate AND
    This results in the sense amplifier being written to the value of the
        function (e.g., Row X AND Row Y)
    If the accumulator contains a "0" (i.e., a voltage corresponding to a
        "0" on node S2 and a voltage corresponding to a "1" on node S1),
        the sense amplifier data is written to a "0"
    If the accumulator contains a "1" (i.e., a voltage corresponding to a
        "1" on node S2 and a voltage corresponding to a "0" on node S1),
        the sense amplifier data remains unchanged (Row Y data)
```

| This operation leaves the data in the accumulator unchanged. |
| --- |
| Deactivate AND |
| Precharge |

In the pseudo code above, "Deactivate EQ" indicates that an equilibration signal corresponding to the sense amplifier 506 is disabled (e.g., such that the complementary data lines 505-1 (D) and 505-2 (D_) are no longer shorted to $V_{DD}/2$), which is illustrated in FIG. 7 at $t_8$. After equilibration is disabled, a selected row (e.g., ROW Y) is enabled as indicated in the pseudo code above by "Open Row Y" and shown in FIG. 7 at $t_9$. When the voltage signal applied to ROW Y reaches the threshold voltage (Vt) of the access transistor (e.g., 502-1) corresponding to the selected cell, the access transistor turns on and couples the data line (e.g., D_505-1) to the selected cell (e.g., to capacitor 503-1) which creates a differential voltage signal between the data lines.

After Row Y is enabled, in the pseudo code above, "Fire Sense Amps" indicates that the sense amplifier 506 is enabled to amplify the differential signal between 505-1 (D) and 505-2 (D_), resulting in a voltage (e.g., $V_{DD}$) corresponding to a logic 1 or a voltage (e.g., GND) corresponding to a logic 0 being on data line 505-1 (D) (and the voltage corresponding to the other logic state being on complementary data line 505-2 (D_)). As shown at $t_{10}$ in FIG. 7, the ACT positive control signal (e.g., 690 shown in FIG. 6) goes high and the RnIF negative control signal (e.g., 628 shown in FIG. 6) goes low to fire the sense amps. The sensed data value from memory cell 502-1 is stored in the primary latch of sense amplifier 506, as previously described. The secondary latch still corresponds to the data value from memory cell 502-2 since the dynamic latch is unchanged.

After the second data value sensed from the memory cell 502-1 coupled to Row Y is stored in the primary latch of sense amplifier 506, in the pseudo code above, "Close Row Y" indicates that the selected row (e.g., ROW Y) can be disabled if it is not desired to store the result of the AND logical operation back in the memory cell corresponding to Row Y. However, FIG. 7 shows that Row Y is left enabled such that the result of the logical operation can be stored back in the memory cell corresponding to Row Y. Isolating the memory cell corresponding to Row Y can be accomplished by the access transistor turning off to decouple the selected cell 502-1 from the data line 505-1 (D). After the selected Row Y is configured (e.g., to isolate the memory cell or not isolate the memory cell), "Activate AND" in the pseudo code above indicates that the AND control signal goes high as shown in FIG. 7 at $t_{11}$, causing pull-down transistor 507-1 to conduct. In this manner, activating the AND control signal causes the value of the function (e.g., Row X AND Row Y) to be written to the sense amp.

With the first data value (e.g., Row X) stored in the dynamic latch of the accumulator 531 and the second data value (e.g., Row Y) stored in the sense amplifier 506, if the dynamic latch of the compute component 531 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 509-1 to conduct thereby coupling the sense amplifier 506 to ground through transistor 509-1, pull-down transistor 507-1 and data line 505-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 506. This operation leaves the data value in the accumulator unchanged (e.g., from Row X).

If the secondary latch of the accumulator contains a "1" (e.g., from Row X), then the result of the AND operation depends on the data value stored in the sense amplifier 506 (e.g., from Row Y). The result of the AND operation should be a "1" if the data value stored in the sense amplifier 506 (e.g., from Row Y) is also a "1," but the result of the AND operation should be a "0" if the data value stored in the sense amplifier 506 (e.g., from Row Y) is also a "0." The sensing circuitry 550 is configured such that if the dynamic latch of the accumulator contains a "1" (i.e., a voltage corresponding to a "1" on node S2 and a voltage corresponding to a "0" on node S1), transistor 509-1 does not conduct, the sense amplifier is not coupled to ground (as described above), and the data value previously stored in the sense amplifier 506 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 506, "Deactivate AND" in the pseudo code above indicates that the AND control signal goes low as shown at $t_{12}$ in FIG. 7, causing pull-down transistor 507-1 to stop conducting to isolate the sense amplifier 506 (and data line 505-1 (D)) from ground. If not previously done, Row Y can be closed (as shown at $t_{13}$ in FIG. 7) and the sense amplifier can be disabled (as shown at $t_{14}$ in FIG. 7 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 7).

FIG. 7 shows, in the alternative, the behavior of voltage signals on the data lines (e.g., 505-1 (D) and 505-2 (D_) shown in FIG. 5) coupled to the sense amplifier (e.g., 506 shown in FIG. 5) and the behavior of voltage signals on nodes S1 and S1 of the secondary latch of the compute component (e.g., 531 shown in FIG. 5) for an AND logical operation involving each of the possible combination of operands (e.g., Row X/Row Y data values 00, 10, 01, and 11).

Although the timing diagrams illustrated in FIG. 7 and the pseudo code described above indicate initiating the AND logical operation after starting to load the second operand (e.g., Row Y data value) into the sense amplifier, the circuit shown in FIG. 5 can be successfully operated by initiating the AND logical operation before starting to load the second operand (e.g., Row Y data value) into the sense amplifier.

Figure 8:
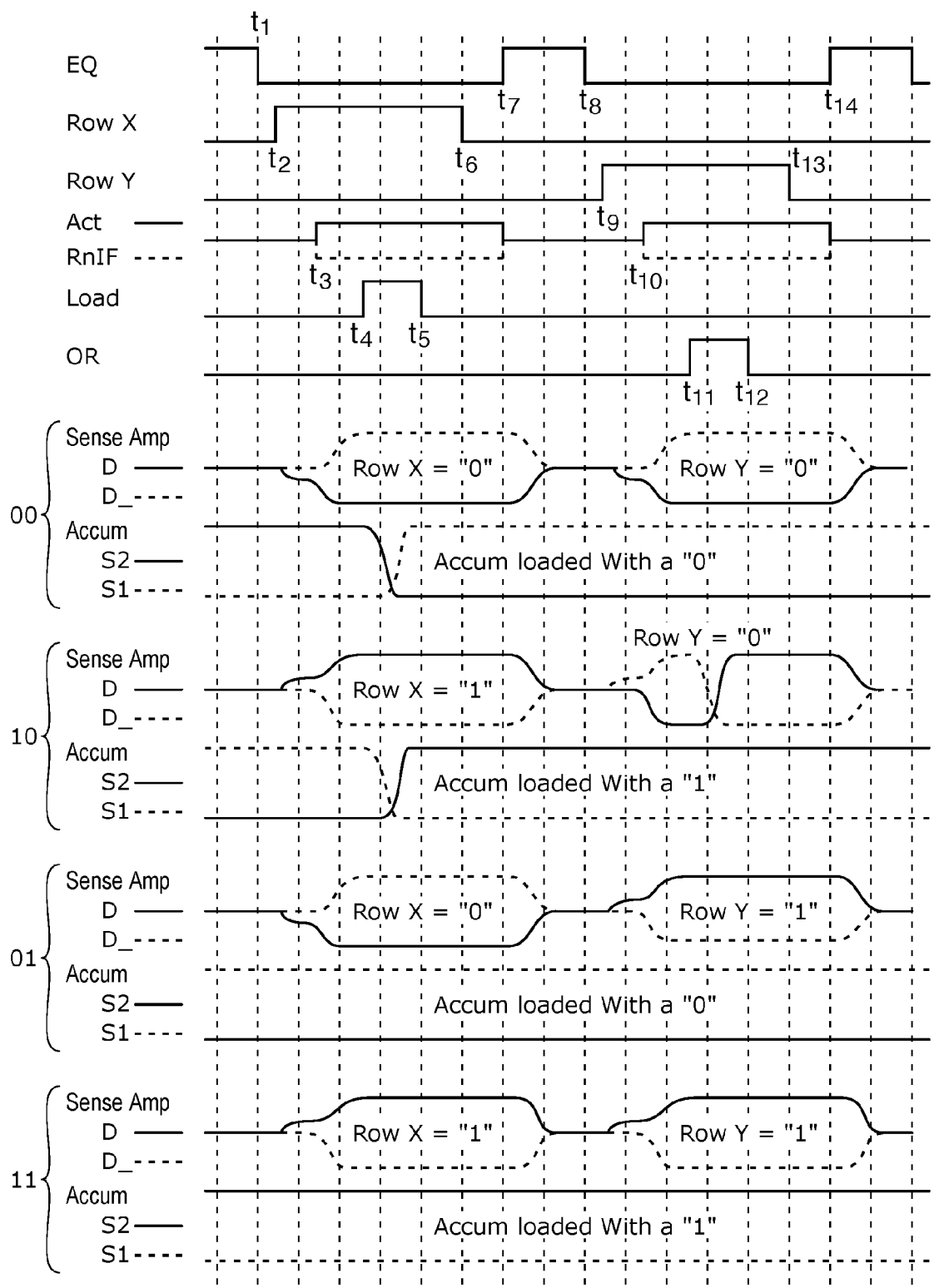
FIG. 8 illustrates a timing diagram associated with performing a number of logical operations using sensing circuitry in accordance with a number of embodiments of the present disclosure.

FIG. 8 illustrates a timing diagram associated with performing a number of logical operations using sensing circuitry in accordance with a number of embodiments of the present disclosure. FIG. 8 illustrates a timing diagram associated with initiating an OR logical operation after starting to load the second operand (e.g., Row Y data value) into the sense amplifier. FIG. 8 illustrates the sense amplifier and accumulator signals for various combinations of first and second operand data values. The particular timing diagram signals are discussed below with respect to the pseudo code associated with an AND logical operation of the circuit shown in FIG. 5.

A subsequent operation phase can alternately be associated with performing the OR operation on the first data value (now stored in the sense amplifier 506 and the secondary latch of the compute component 531) and the second data value (stored in a memory cell 502-1 coupled to Row Y 504-Y). The operations to load the Row X data into the sense amplifier and accumulator that were previously described with respect to times $t_1$-$t_7$ shown in FIG. 7 are not repeated with respect to FIG. 8. Example pseudo code associated with "ORing" the data values can include:

```
Deactivate EQ
Open Row Y
Fire Sense Amps (after which Row Y data resides in the sense amps)
Close Row Y
    When Row Y is closed, the sense amplifier still contains the Row Y
        data value.
Activate OR
    This results in the sense amplifier being written to the value of the
        function (e.g., Row X OR Row Y), which may overwrite the data
        value from Row Y previously stored in the sense amplifier as
        follows:
    If the accumulator contains a "0" (i.e., a voltage corresponding to a
        "0" on node S2 and a voltage corresponding to a "1" on node S1),
        the sense amplifier data remains unchanged (Row Y data)
    If the accumulator contains a "1" (i.e., a voltage corresponding to a
        "1" on node S2 and a voltage corresponding to a "0" on node S1),
        the sense amplifier data is written to a "1"
    This operation leaves the data in the accumulator unchanged.
Deactivate OR
Precharge
```

The "Deactivate EQ" (shown at $t_8$ in FIG. 8), "Open Row Y" (shown at $t_9$ in FIG. 8), "Fire Sense Amps" (shown at $t_{10}$ in FIG. 8), and "Close Row Y" (shown at $t_{13}$ in FIG. 8, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 8, which causes pull-down transistor 507-2 to conduct. In this manner, activating the OR control signal causes the value of the function (e.g., Row X OR Row Y) to be written to the sense amp.

With the first data value (e.g., Row X) stored in the secondary latch of the compute component 531 and the second data value (e.g., Row Y) stored in the sense amplifier 506, if the dynamic latch of the accumulator contains a "0" (i.e., a voltage corresponding to a "0" on node S2 and a voltage corresponding to a "1" on node S1), then the result of the OR operation depends on the data value stored in the sense amplifier 506 (e.g., from Row Y). The result of the OR operation should be a "1" if the data value stored in the sense amplifier 506 (e.g., from Row Y) is a "1," but the result of the OR operation should be a "0" if the data value stored in the sense amplifier 506 (e.g., from Row Y) is also a "0." The sensing circuitry 550 is configured such that if the dynamic latch of the accumulator contains a "0," with the voltage corresponding to a "0" on node S2, transistor 509-2 is off and does not conduct (and pull-down transistor 507-1 is also off since the AND control signal is not asserted) so the sense amplifier 506 is not coupled to ground (either side), and the data value previously stored in the sense amplifier 506 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 509-2 does conduct (as does pull-down transistor 507-2 since the OR control signal is asserted), and the sense amplifier 506 input coupled to data line 505-2 (D_) is coupled to ground since the voltage corresponding to a "1" on node S2 causes transistor 509-2 to conduct along with pull-down transistor 507-2 (which also conducts since the OR control signal is asserted). In this manner, a "1" is initially stored in the sense amplifier 506 as a result of the OR operation when the secondary latch of the accumulator contains a "1" regardless of the data value previously stored in the sense amp. This operation leaves the data in the accumulator unchanged. FIG. 8 shows, in the alternative, the behavior of voltage signals on the data lines (e.g., 505-1 (D) and 505-2 (D_) shown in FIG. 5) coupled to the sense amplifier (e.g., 506 shown in FIG. 5) and the behavior of voltage signals on nodes S1 and S2 of the secondary latch of the compute component 531 for an OR logical operation involving each of the possible combination of operands (e.g., Row X/Row Y data values 00, 10, 01, and 11).

After the result of the OR operation is initially stored in the sense amplifier 506, "Deactivate OR" in the pseudo code above indicates that the OR control signal goes low as shown at $t_{12}$ in FIG. 8, causing pull-down transistor 507-2 to stop conducting to isolate the sense amplifier 506 (and data line D 505-2) from ground. If not previously done, Row Y can be closed (as shown at $t_{13}$ in FIG. 8) and the sense amplifier can be disabled (as shown at $t_{14}$ in FIG. 8 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 8.

The sensing circuitry 550 illustrated in FIG. 5 can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value (e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 514-1 to conduct and activating the ANDinv control signal causes transistor 514-2 to conduct. In each case, asserting the appropriate inverted control signal can flip the sense amplifier and cause the result initially stored in the sense amplifier 506 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 5 can perform a NOT (e.g., invert) operation by putting the non-inverted data value into the dynamic latch of the accumulator and using that data to invert the data value in the sense amplifier 506. As previously mentioned, activating the ORinv control signal causes transistor 514-1 to conduct and activating the ANDinv control signal causes transistor 514-2 to conduct. The ORinv and/or ANDinv control signals are used in implementing the NOT function, as described further below:

---
Copy Row X into the Accumulator
   Deactivate EQ
   Open Row X
   Fire Sense Amps (after which Row X data resides in the sense amps)
   Activate LOAD (sense amplifier data (Row X) is transferred to nodes
     S1 and S2 of the Accumulator and resides there dynamically
   Deactivate LOAD
   Activate ANDinv and ORinv (which puts the compliment data value
     on the data lines)
     This results in the data value in the sense amplifier being inverted
      (e.g., the sense amplifier latch is flipped)
     This operation leaves the data in the accumulator unchanged
   Deactivate ANDinv and ORinv
   Close Row X
   Precharge
---

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and precharging after the Row X data is loaded into the sense amplifier 506 and copied into the dynamic latch, a complement version of the data value in the dynamic latch of the accumulator can be placed on the data line and thus transferred to the sense amplifier 506 by enabling (e.g., causing transistor to conduct) and disabling the invert transistors (e.g., ANDinv and ORinv). This results in the sense amplifier 506 being flipped from the true data value that was previously stored in the sense amplifier to a complement data value (e.g., inverted data value) stored in the sense amp. That is, a true or complement version of the data value in the accumulator can be transferred to the sense amplifier by activating and deactivating ANDinv and ORinv. This operation leaves the data in the accumulator unchanged.

Because the sensing circuitry 550 shown in FIG. 5 initially stores the result of the AND, OR, and NOT logical operations in the sense amplifier 506 (e.g., on the sense amplifier nodes), these logical operation results can be communicated easily and quickly to any enabled row and/or into the secondary latch of the compute component 531. The sense amplifier 506 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 506 fires.

When performing logical operations in this manner, the sense amplifier 506 can be pre-seeded with a data value from the dynamic latch of the accumulator to reduce overall current utilized because the sense amps 506 are not at full rail voltages (e.g., supply voltage or ground/reference voltage) when accumulator function is copied to the sense amplifier 506. An operation sequence with a pre-seeded sense amplifier 506 either forces one of the data lines to the reference voltage (leaving the complementary data line at $V_{DD}/2$, or leaves the complementary data lines unchanged. The sense amplifier 506 pulls the respective data lines to full rails when the sense amplifier 506 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 523 can be used for shifting data values stored in memory cells coupled to a particular pair of complementary data lines to the sensing circuitry 550 (e.g., sense amplifier 506) corresponding to a different pair of complementary data lines (e.g., such as a sense amplifier 506 corresponding to a left or right adjacent pair of complementary data lines. As used herein, a sense amplifier 506 corresponds to the pair of complementary data lines to which the sense amplifier is coupled when isolation transistors 521-1 and 521-2 are conducting. The SHIFT operations (right or left) do not pre-copy the Row X data value into the accumulator. Operations to shift right Row X can be summarized as follows:

---
Deactivate Norm and Activate Shift
Deactivate EQ
Open Row X
Fire Sense Amps (after which shifted Row X data
resides in the sense amps)
Activate Norm and Deactivate Shift
Close Row X
Precharge
---

In the pseudo code above, "Deactivate Norm and Activate Shift" indicates that a NORM control signal goes low causing isolation transistors 521-1 and 521-2 of the shift circuitry 523 to not conduct (e.g., isolate the sense amplifier from the corresponding pair of complementary data lines). The SHIFT control signal goes high causing isolation transistors 521-3 and 521-4 to conduct, thereby coupling the sense amplifier 506 to the left adjacent pair of complementary data lines (e.g., on the memory array side of non-conducting isolation transistors 521-1 and 521-2 for the left adjacent pair of complementary data lines).

After the shift circuitry 523 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 506.

In the pseudo code above, "Activate Norm and Deactivate Shift" indicates that a NORM control signal goes high causing isolation transistors 521-1 and 521-2 of the shift circuitry 523 to conduct (e.g., coupling the sense amplifier to the corresponding pair of complementary data lines), and the SHIFT control signal goes low causing isolation transistors 521-3 and 521-4 to not conduct and isolating the sense amplifier 506 from the left adjacent pair of complementary data lines (e.g., on the memory array side of non-conducting isolation transistors 521-1 and 521-2 for the left adjacent pair of complementary data lines). Since Row X is still active, the Row X data value that has been shifted right is transferred to Row X of the corresponding pair of complementary data lines through isolation transistors 521-1 and 521-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

---

Activate Norm and Deactivate Shift
Deactivate EQ
Open Row X
Fire Sense Amps (after which Row X data resides in the sense amps)
Deactivate Norm and Activate Shift
    Sense amplifier data (shifted left Row X) is transferred to Row X
Close Row X
Precharge

---

In the pseudo code above, "Activate Norm and Deactivate Shift" indicates that a NORM control signal goes high causing isolation transistors 521-1 and 521-2 of the shift circuitry 523 to conduct, and the SHIFT control signal goes low causing isolation transistors 521-3 and 521-4 to not conduct. This configuration couples the sense amplifier 506 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 550 is stored in the sense amplifier 506.

In the pseudo code above, "Deactivate Norm and Activate Shift" indicates that a NORM control signal goes low causing isolation transistors 521-1 and 521-2 of the shift circuitry 523 to not conduct (e.g., isolate the sense amplifier from the corresponding pair of complementary data lines), and the SHIFT control signal goes high causing isolation transistors 521-3 and 521-4 to conduct coupling the sense amplifier to the left adjacent pair of complementary data lines (e.g., on the memory array side of non-conducting isolation transistors 521-1 and 521-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. A potential advantage of certain example apparatuses and methods described herein can be the cumulative speed that can be achieved by an entire bank of data being computed in parallel without necessarily transferring data out of the memory array (e.g., DRAM) or firing a column decode. For example, data transfer time can be reduced and/or eliminated. Also, a number of apparatuses of the present disclosure can perform ANDS or ORs simultaneously using data values in memory cells coupled to a data line (e.g., a column of 6K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 9:
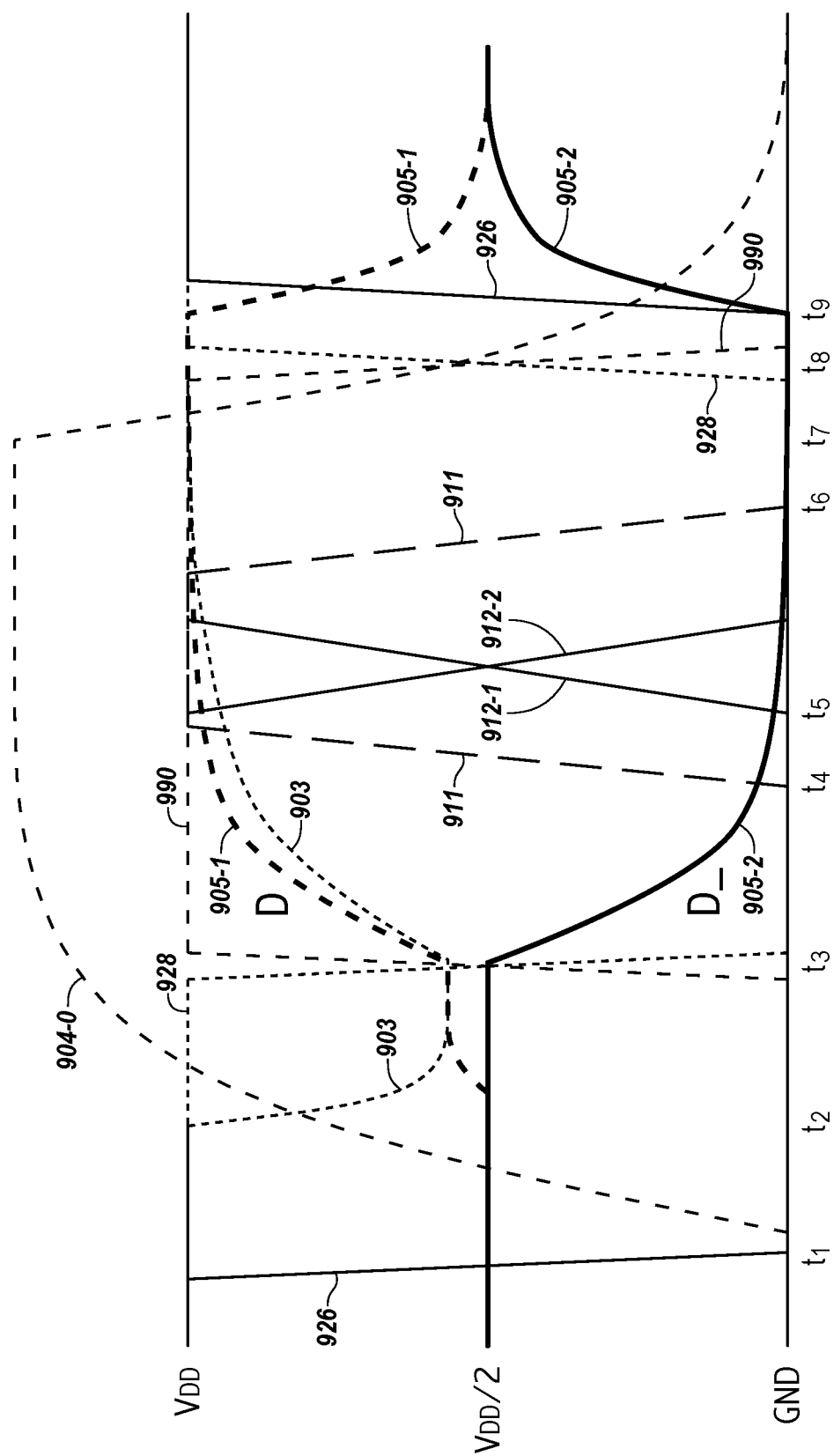
FIG. 9 illustrates a timing diagram associated with performing a number of logical operations using sensing circuitry in accordance with a number of embodiments of the present disclosure.

FIG. 9 illustrates a timing diagram associated with performing a number of logical operations using sensing circuitry 550 shown in FIG. 5 in accordance with a number of embodiments of the present disclosure. The timing diagram shown in FIG. 9 illustrates signals (e.g., voltage signals) associated with performing a first operation phase of a logical operation (e.g., an R-input logical operation). The first operation phase described with respect to FIG. 9 can be a first operation phase of an AND, NAND, OR, or NOR operation, for instance. Performing the operation phase illustrated in FIG. 9 can involve consuming significantly less energy (e.g., about half) than previous processing approaches that may involve providing a full swing between voltage rails (e.g., between a supply and ground).

In the example illustrated in FIG. 9, the voltage rails corresponding to complementary logic values (e.g., "1" and "0") are a supply voltage ($V_{CC}$) and a reference voltage (e.g., ground (Gnd)). Prior to performing a logical operation, an equilibration can occur such that the complementary data lines D and D_ are shorted together at an equilibration voltage ($V_{CC}/2$), as previously described.

The first operation phase of a logical operation described below involves loading a first operand of the logical operation into the accumulator. The time references (e.g., $t_1$, etc.) shown in FIG. 9 do not necessarily represent a same absolute or relative time as similar time references in other timing diagrams. At time $t_1$, the equilibration signal 926 is deactivated, and then a selected row is enabled (e.g., the row corresponding to a memory cell whose data value is to be sensed and used as a first input). Signal 904-0 represents the voltage signal applied to the selected row of memory cells. When row signal 904-0 reaches the threshold voltage (Vt) of the access transistor corresponding to the selected cell, the access transistor turns on and couples the data line D to the selected memory cell (e.g., to the capacitor if the cell is a 1T1C DRAM cell), which creates a differential voltage signal between the data lines (e.g., 505-1 (D) and 505-2 (D_) shown in FIG. 5) (e.g., as indicated by signals 905-1 and 905-2 on the data lines, respectively) between times $t_2$ and $t_3$. The voltage of the selected cell is represented by signal 903. Due to conservation of energy, creating the differential signal between data lines 505-1 (D) and 505-2 (D_) (e.g., by coupling the cell to data line D) does not consume energy, since the energy associated with enabling/disabling the row signal 904-0 can be amortized over the plurality of memory cells coupled to the row.

At time $t_3$, the sense amplifier (e.g., 506 shown in FIG. 5) is enabled by control signal 990 (e.g., ACT shown in FIG. 6) going high and the negative control signal 928 (e.g., RnIF shown in FIG. 2) going low, which amplifies the differential signal between data lines 505-1 (D) and 505-2 (D_), resulting in a voltage (e.g., $V_{CC}$) corresponding to a logic "1" or a voltage (e.g., ground) corresponding to a logic "0" being on data line D (and the other voltage being on complementary data line D_), such that the sensed data value is stored in the primary latch of sense amplifier 506. The primary energy consumption occurs in charging the data line 505-1 (D) from the equilibration voltage $V_{CC}/2$ to the rail voltage $V_{CC}$.

According to some embodiments, the primary latch of sense amplifier 506 can be coupled to the complementary data lines D and D_ through respective sense amplifier pass transistors (e.g., a second set of pass transistors between the sense amplifier 506 and the complementary data lines D and D_). Sense amplifier pass transistors, through which one node (e.g., S1) of the primary latch of sense amplifier 506 is coupled to the data line D can be controlled by a PASSD control signal 911 and the sense amplifier pass transistor through which another node (e.g., S2) of the primary latch of sense amplifier 506 is coupled to the data line D_ can be controlled by a PASSDB control signal, which can behave here the same as the PASSD control signal.

At time $t_4$, the sense amplifier pass transistors can be enabled (e.g., via respective PASSD and PASSDB control signals applied to control lines coupled to the respective gates of the sense amplifier pass transistors. At time $t_5$, accumulator control signals 912-1 (e.g., ACCUM) and 912-2 (e.g., ACCUMB) are activated via respective control lines 512-1 and 512-2 (e.g., where the accumulator is not constantly enabled by coupling control line 512-1 to GND and coupling control line 512-2 to $V_{DD}$). As described below, the accumulator control signals 912-1 and 912-2 may remain activated for subsequent operation phases. As such, in this example, activating the ACCUMB and ACCUM control signals 912-1 and 912-2 enables the secondary latch (e.g., serving as an accumulator) of compute component 531. The sensed data value stored in sense amplifier 506 is transferred (e.g., copied) to the secondary latch 564.

At time $t_6$, the sense amplifier pass transistors are disabled (e.g., turned off) by the PASSD and PASSDB control signals 911 going low. However, since the accumulator control signals 912-1 and 912-2 remain activated, an accumulated result is stored (e.g., latched) in the secondary latch (e.g., serving as an accumulator). At time $t_7$, the row signal 904-0 is deactivated, and the array sense amplifiers are disabled at time $t_8$ (e.g., control signals 928 and 990 enabling the sense amplifier are deactivated).

At time $t_9$, the data lines D and D_ are equilibrated (e.g., equilibration signal 926 is activated), as illustrated by data line voltage signals 905-1 and 905-2 moving from their respective rail values to the equilibration voltage ($V_{CC}/2$). The equilibration consumes little energy due to the law of conservation of energy. As described previously in association with FIG. 2, equilibration can involve shorting the complementary data lines D and D_ together at an equilibration voltage, which is $V_{CC}/2$, in this example. Equilibration can occur, for instance, prior to a memory cell sensing operation.

Figure 10:
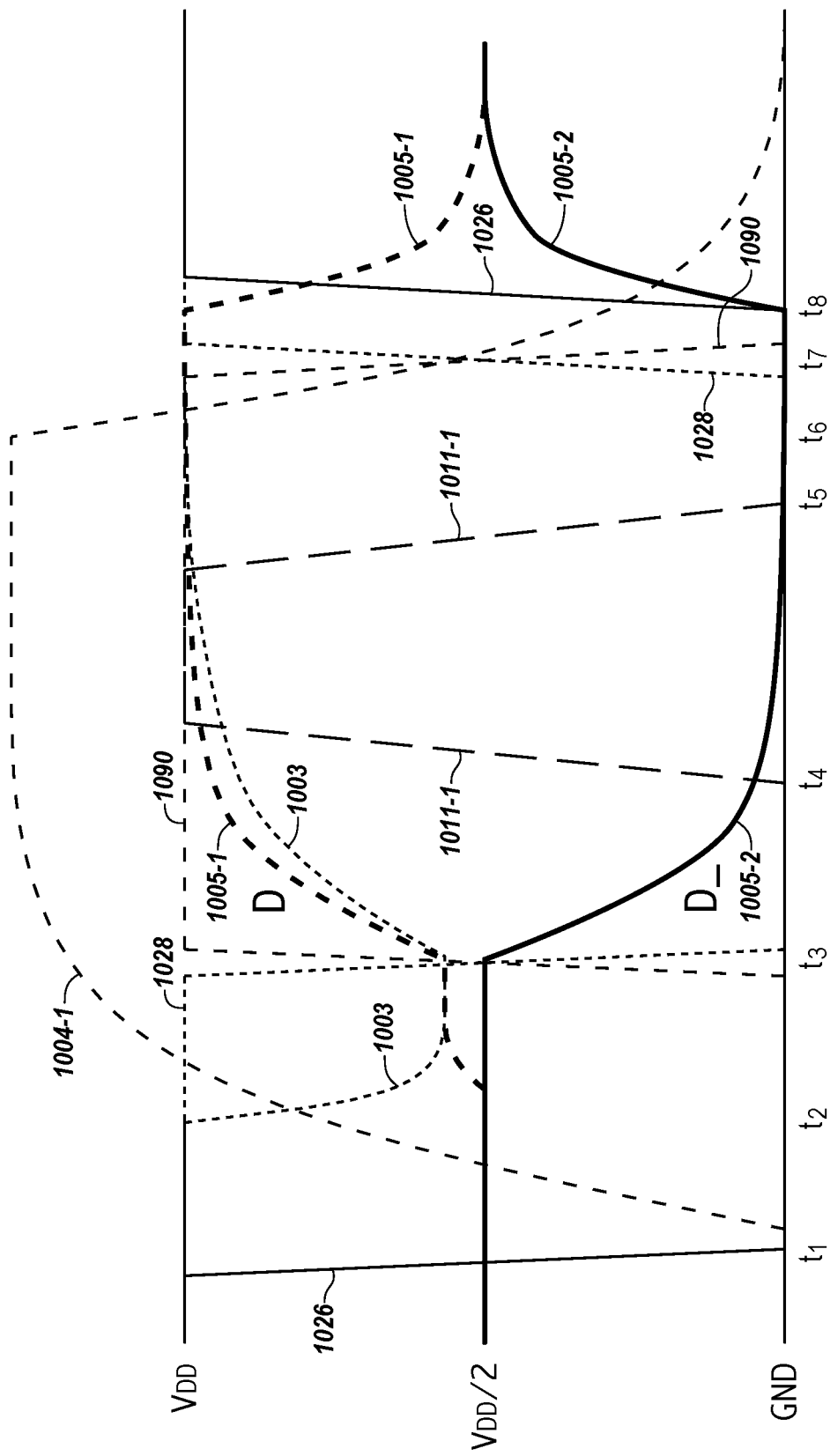
FIG. 10 illustrates a timing diagram associated with performing a number of logical operations using sensing circuitry in accordance with a number of embodiments of the present disclosure.
Figure 11:
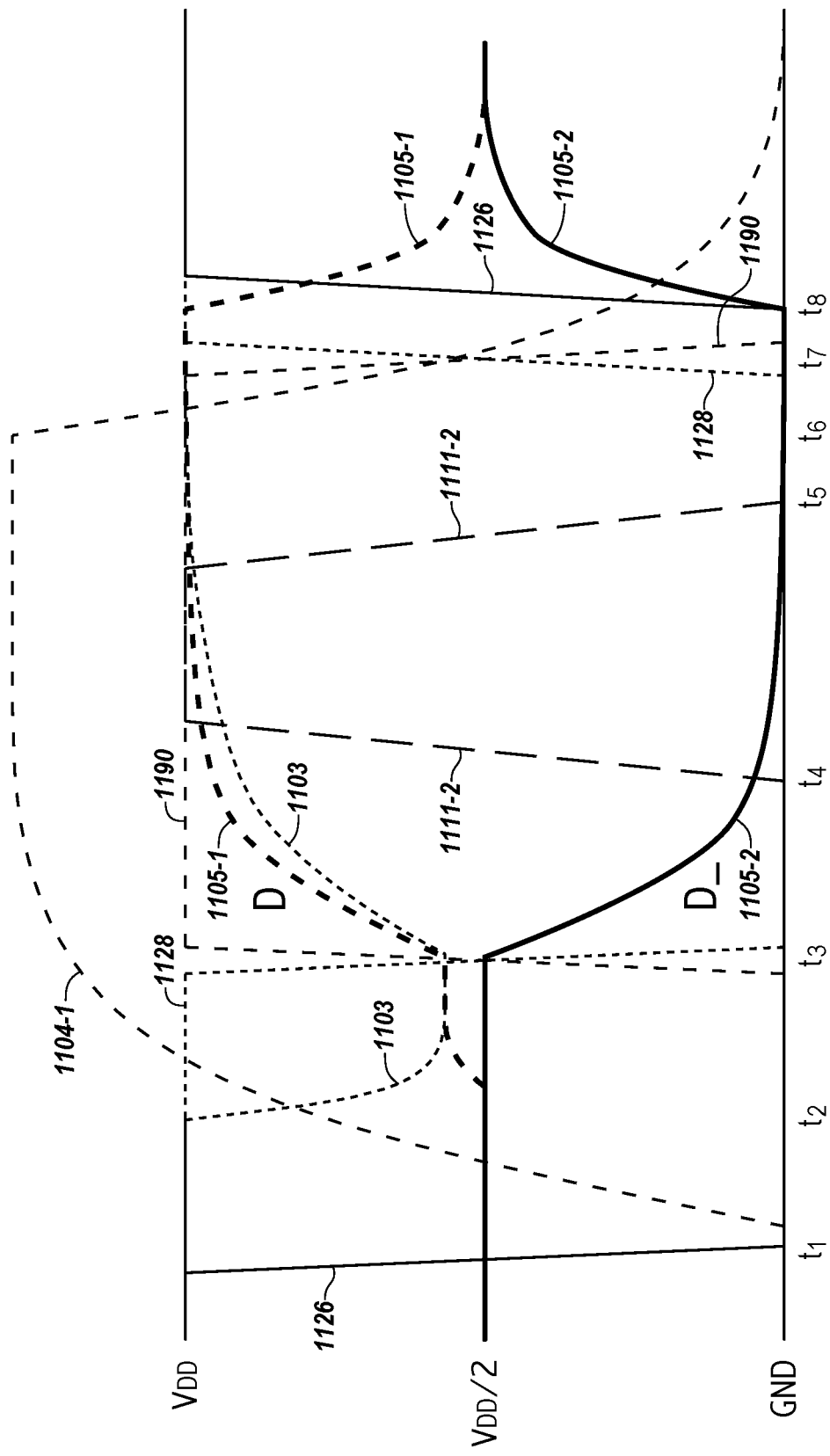
FIG. 11 illustrates a timing diagram associated with performing a number of logical operations using sensing circuitry in accordance with a number of embodiments of the present disclosure.

FIGS. 10 and 11 respectively illustrate timing diagrams associated with performing a number of logical operations using sensing circuitry in accordance with a number of embodiments of the present disclosure. Timing diagrams shown in FIGS. 10 and 11 illustrate signals (e.g., voltage signals) associated with performing a number of intermediate operation phases of a logical operation (e.g., an R-input logical operation). For example, performing an AND or NAND operation can include performing the operation phase shown in FIG. 10 one or more times subsequent to an initial operation phase such as that described with respect to FIG. 9. Similarly, performing an OR or NOR operation can include performing the operation phase shown and described with respect to FIG. 11 one or more times subsequent to an initial operation phase such as that described with respect to FIG. 9.

As shown in the timing diagrams illustrated in FIGS. 10 and 11, at time $t_1$, equilibration is disabled (e.g., the equilibration signal 1026/1126 is deactivated), and then a selected row is enabled (e.g., the row corresponding to a memory cell whose data value is to be sensed and used as an input such as a second input, third input, etc.). Signal 1004-1/1104-1 represents the voltage signal applied to the selected row. When row signal 1004-1/1104-1 reaches the threshold voltage (Vt) of the access transistor corresponding to the selected cell, the access transistor turns on and couples the data line D to the selected memory cell (e.g., to the capacitor if the cell is a 1T1C DRAM cell), which creates a differential voltage signal between the data lines D and D_ (e.g., as indicated by signals 1005-1/1105-1 and 1005-2/1105-2, respectively) between times $t_2$ and $t_3$. The voltage of the selected cell is represented by signal 1003/1103. Due to conservation of energy, creating the differential signal between D and D_ (e.g., by coupling the cell to data line D) does not consume energy, since the energy associated with activating/deactivating the row signal 1004-1/1104-1 can be amortized over the plurality of memory cells coupled to the row.

At time $t_3$, the sense amplifier (e.g., 506 shown in FIG. 5) is enabled (e.g., a positive control signal 1090/1190 (e.g., corresponding to ACT 690 shown in FIG. 6) goes high, and the negative control signal 1028/1128 (e.g., RnIF 628 shown in FIG. 6) goes low), which amplifies the differential signal between D and D_, resulting in a voltage (e.g., $V_{CC}$) corresponding to a logic "1" or a voltage (e.g., ground) corresponding to a logic "0" being on data line D (and the other voltage being on complementary data line D_), such that the sensed data value is stored in the primary latch of sense amplifier 506. The primary energy consumption occurs in charging the data line D (505-1) from the equilibration voltage $V_{CC}/2$ to the rail voltage $V_{CC}$.

As shown in timing diagrams illustrated in FIGS. 10 and 11, at time $t_4$ (e.g., after the selected cell is sensed), only one of control signals 1011-1 (PASSD) shown in FIGS. 10 and 1111-2 (PASSDB) shown in FIG. 11 is activated (e.g., only one of pass transistors (if present) is enabled), depending on the particular logic operation. For example, since the timing diagram illustrated in FIG. 10 corresponds to an intermediate phase of a NAND or AND operation, control signal 1011-1 (PASSD) is activated at time t4 to turn on the pass transistor coupling the primary latch to data line D and the PASSDB control signal remains deactivated leaving the pass transistor coupling the primary latch to data line D_ turned off. Conversely, since the timing diagram illustrated in FIG. 11 corresponds to an intermediate phase of a NOR or OR operation, control signal 1111-2 (PASSDB) is activated at time t4 to turn on the pass transistor coupling the primary latch to data line D_ and control signal PASSD remains deactivated leaving the pass transistor coupling the primary latch to data line D turned off. Recall from above that the accumulator control signals 912-1 (Accumb) and 912-2 (Accum) were activated during the initial operation phase described with respect to FIG. 9, and they remain activated during the intermediate operation phase(s).

Since the accumulator was previously enabled, activating only PASSD (1011-1 as shown in FIG. 10) results in accumulating the data value corresponding to the voltage signal 1005-1 shown in FIG. 10 corresponding to data line D. Similarly, activating only PASSDB (1111-2 as shown in FIG. 11) results in accumulating the data value corresponding to the voltage signal 1105-2 corresponding to data line D_. For instance, in an example AND/NAND operation shown in the timing diagram illustrated in FIG. 4 in which only PASSD (1011-1) is activated, if the data value stored in the second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 11 in which only PASSDB 1111-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 1105-2 on D_ is setting the true data value of the accumulator.

At the conclusion of an intermediate operation phase such as that shown in FIG. 10 or 11, the PASSD signal 1011-1 (e.g., for AND/NAND) or the PASSDB signal 1111-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 10 or 11 can be repeated in order to accumulate results from a number of additional rows. As an example, the sequence of timing diagram illustrated in FIG. 10 and/or 11 can be performed a subsequent (e.g., second) time for a third memory cell, a subsequent (e.g., third) time for a fourth memory cell, etc. For instance, for a 10-input NOR operation, the intermediate phase shown in FIG. 11 can occur 9 times to provide 9 inputs of the 10-input logical operation, with the tenth input being determined during the initial operation phase (e.g., as described with respect to FIG. 9).

Figure 12:
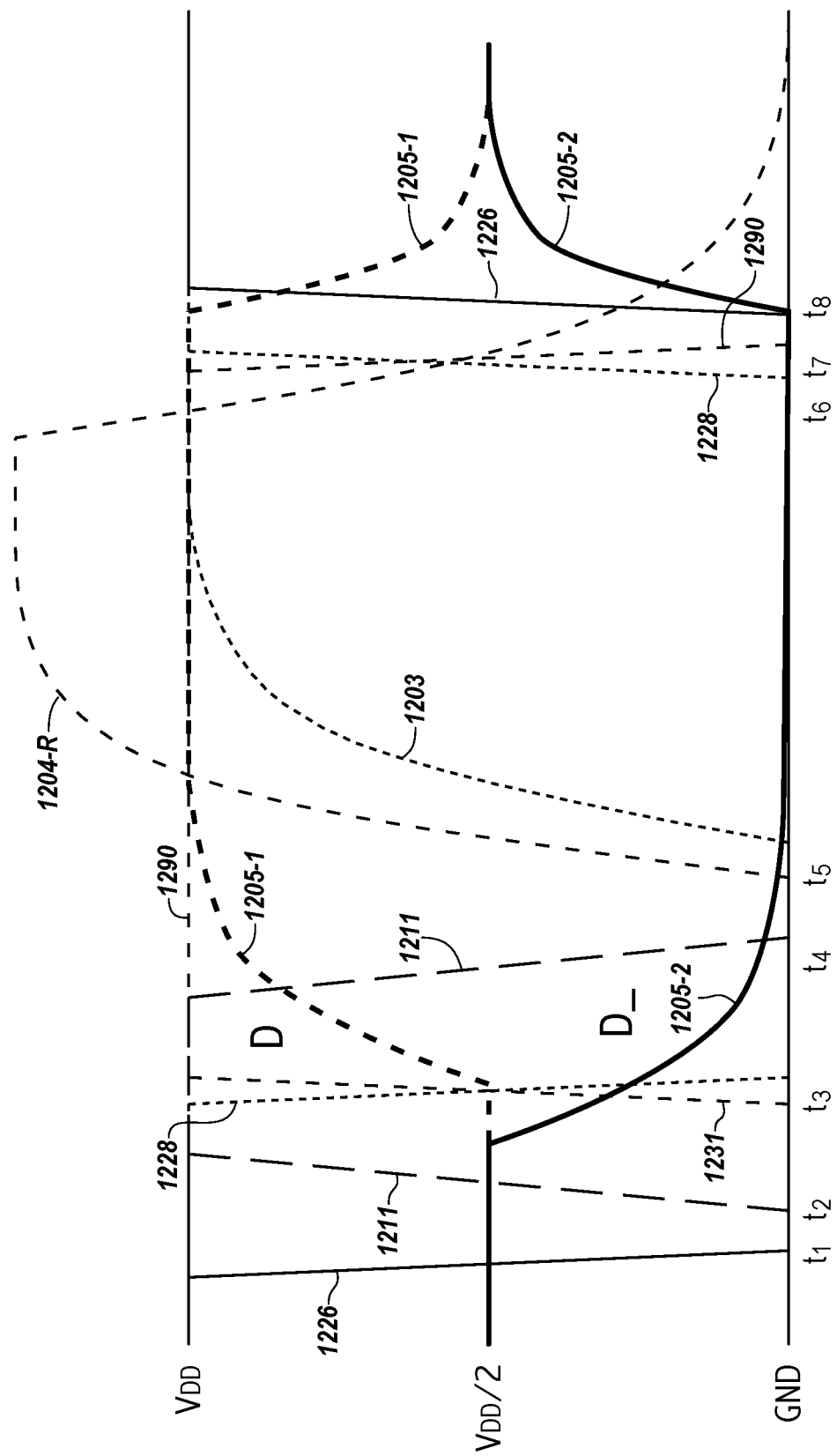
FIG. 12 illustrates a timing diagram associated with performing a number of logical operations using sensing circuitry in accordance with a number of embodiments of the present disclosure.

FIG. 12 illustrates a timing diagram associated with performing a number of logical operations using sensing circuitry in accordance with a number of embodiments of the present disclosure. The timing diagram illustrated in FIG. 12 shows signals (e.g., voltage signals) associated with performing a last operation phase of a logical operation (e.g., an R-input logical operation). For instance, the timing diagram illustrated in FIG. 12 corresponds to a last operation phase of an R-input AND operation or an R-input OR operation.

For example, performing a last operation phase of an R-input can include performing the operation phase shown in FIG. 12 subsequent to a number of iterations of the intermediate operation phase(s) described in association with FIG. 10 and/or 11. Table 1 shown below indicates the Figures corresponding to the sequence of operation phases associated with performing a number of R-input logical operations in accordance with a number of embodiments described herein.

TABLE 1

| Operation | FIG. 9 | FIG. 10 | FIG. 11 | FIG. 12 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

The last operation phase illustrated in the timing diagram of FIG. 12 is described in association with storing a result of an R-input logical operation to a row of the array. However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 12, at time $t_1$, equilibration is disabled (e.g., the equilibration signal 1226 is deactivated) such that data lines D and D_ are floating. At time $t_2$, the PASSD control signal 1211 (and PASSDB signal) is activated for an AND or OR operation.

Activating the PASSD control signal 1211 (and PASSDB signal) (e.g., in association with an AND or OR operation) transfers the accumulated output stored in the secondary latch 564 of compute component 531-1 shown in FIG. 5 to the primary latch of sense amplifier 506. For instance, for an AND operation, if any of the memory cells sensed in the prior operation phases (e.g., the first operation phase illustrated in FIG. 9 and one or more iterations of the intermediate operation phase illustrated in FIG. 10) stored a logic "0" (e.g., if any of the R-inputs of the AND operation were a logic "0"), then the data line D_ will carry a voltage corresponding to logic "1" (e.g., $V_{CC}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1".

At time t3, the primary latch of sense amplifier 506 is then enabled (e.g., a positive control signal 1290 (e.g., corresponding to ACT 690 shown in FIG. 6) goes high and the negative control signal 1228 (e.g., corresponding to RnIF 628 shown in FIG. 6) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{CC}$ if all of the input data values are a logic "1."

For an OR operation, if any of the memory cells sensed in the prior operation phases (e.g., the first operation phase of FIG. 9 and one or more iterations of the intermediate operation phase shown in FIG. 11) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{CC}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 506 is then enabled and the data line D now carries the ORed result of the respective input data values as determined from the memory cells sensed during the prior operation phases. As such, data line D will be at $V_{CC}$ if any of the input data values are a logic "1" and data line D will be at ground if all of the input data values are a logic "0."

The result of the R-input AND or OR logical operations can then be stored back to a memory cell of array 130 shown in FIG. 1. In the examples shown in FIG. 12, the result of the R-input logical operation is stored to a memory cell coupled to the last row opened (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 12 shows, at time t7, the positive control signal 1290 and the negative control signal 1228 being deactivated (e.g., signal 1290 goes low and signal 1228 goes high) to disable the sense amplifier 506 shown in FIG. 5. At time t4 the PASSD control signal 1211 (and PASSDB signal) that was activated at time t2 is deactivated. Embodiments are not limited to this example. For instance, in a number of embodiments, the sense amplifier 506 shown in FIG. 5 may be enabled subsequent to time t4 (e.g., after the PASSD control signal 1211 (and PASSDB signal) are deactivated).

As shown in FIG. 12, at time t5, a selected row is enabled (e.g., by row enabling signal 1204 going high, which drives the capacitor of the selected cell to the voltage corresponding to the logic value stored in the accumulator. At time t6 the selected row is disabled. At time t7 the sense amplifier 506 shown in FIG. 5 is disabled (e.g., positive control signal 1228 and negative control signal 1290 are deactivated), and at time t8 equilibration occurs (e.g., signal 1226 is activated and the voltages on the complementary data lines 1205-1 (D) and 1205-2 (D_) are brought to the equilibration voltage).

Although the example of performing a last operation phase of an R-input was discussed above with respect to FIG. 12 for performing AND and OR logical operations, embodiments are not limited to these logical operations. For example, the NAND and NOR operations can also involve a last operation phase of an R-input that is stored back to a memory cell of array 130 (shown in FIG. 1) using control signals to operate the sensing circuitry illustrated in FIG. 5.

Figure 13:
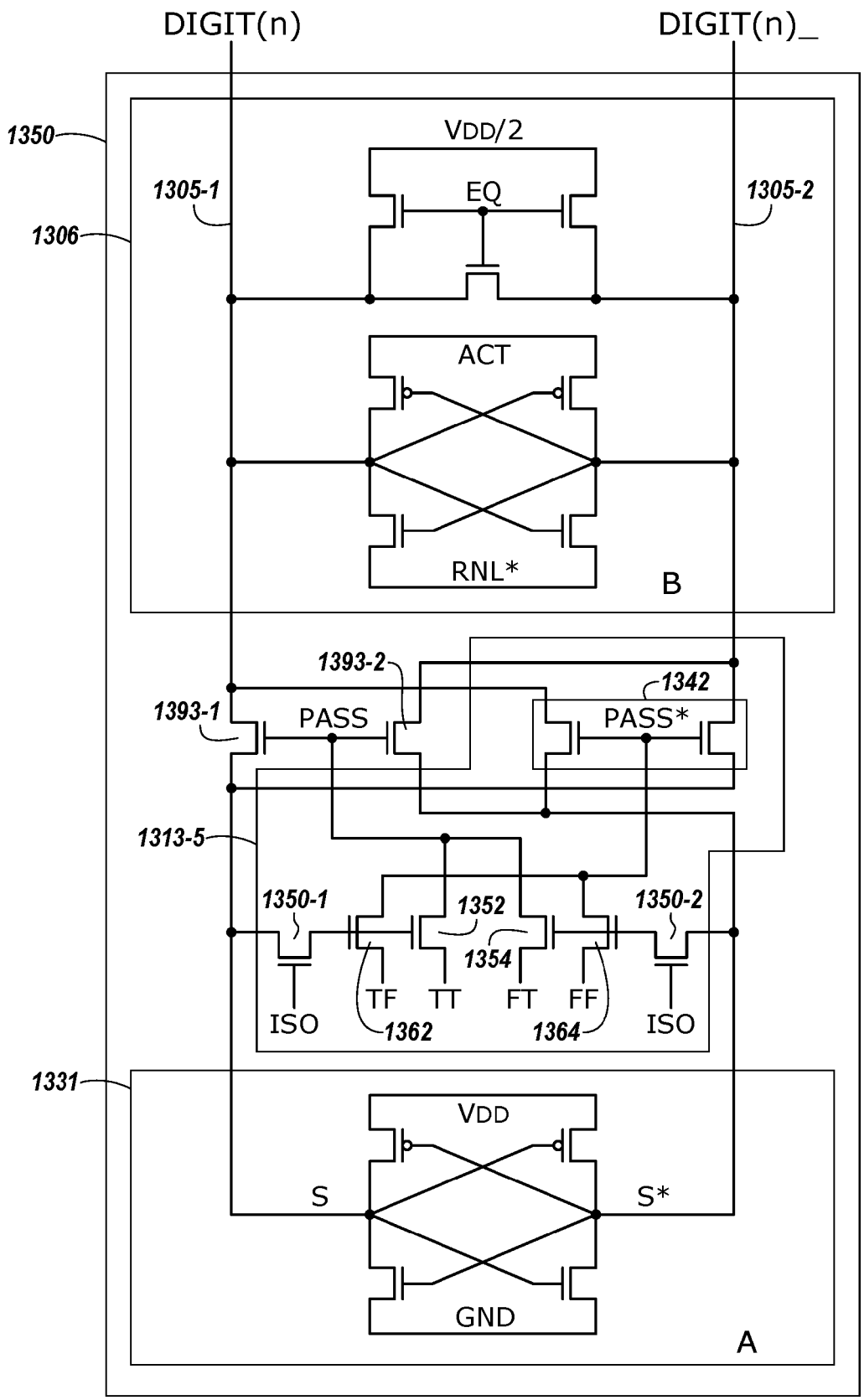
FIG. 13 is a schematic diagram illustrating sensing circuitry having selectable logical operation selection logic in accordance with a number of embodiments of the present disclosure.

FIG. 13 is a schematic diagram illustrating sensing circuitry having selectable logical operation selection logic in accordance with a number of embodiments of the present disclosure. FIG. 13 shows a sense amplifier 1306 coupled to a pair of complementary sense lines 1305-1 and 1305-2, and a compute component 1331 coupled to the sense amplifier 1306 via pass gates 1393-1 and 1393-2. The gates of the pass gates 1393-1 and 1393-2 can be controlled by a logical operation selection logic signal, PASS, which can be output from logical operation selection logic 1313-5. FIG. 13 shows the compute component 1331 labeled "A" and the sense amplifier 1306 labeled "B" to indicate that the data value stored in the compute component 1331 is the "A" data value and the data value stored in the sense amplifier 1306 is the "B" data value shown in the logic tables illustrated with respect to FIG. 14.

The sensing circuitry 1350 illustrated in FIG. 13 includes logical operation selection logic 1313-5. In this example, the logic 1313-5 comprises swap gates 1342 controlled by a logical operation selection logic signal PASS*. The logical operation selection logic 1313-5 also comprises four logic selection transistors: logic selection transistor 1362 coupled between the gates of the swap transistors 1342 and a TF signal control line, logic selection transistor 1352 coupled between the gates of the pass gates 1393-1 and 1393-2 and a TT signal control line, logic selection transistor 1354 coupled between the gates of the pass gates 1393-1 and 1393-2 and a FT signal control line, and logic selection transistor 1364 coupled between the gates of the swap transistors 1342 and a FF signal control line. Gates of logic selection transistors 1362 and 1352 are coupled to the true sense line (e.g., 1305-1) through isolation transistor 1350-1 (having a gate coupled to an ISO signal control line), and gates of logic selection transistors 1364 and 1354 are coupled to the complementary sense line (e.g., 1305-2) through isolation transistor 1350-2 (also having a gate coupled to an ISO signal control line).

Operation of logic selection transistors 1352 and 1354 are similar based on the state of the TT and FT selection signals and the data values on the respective complementary sense lines at the time the ISO signal is asserted. Logic selection transistors 1362 and 1364 also operate in a similar manner to control (e.g., enable by turning on or disable by turning off) the swap transistors 1342. That is, to enable (e.g., turn on) the swap transistors 1342, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1342 will not be enabled by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines DIGIT(n)/ DIGIT(n)_ together, which may be a disruptive configuration to be avoided. Logical operations results for the sensing circuitry illustrated in FIG. 13 are summarized in the logic table illustrated in FIG. 14.

Figure 14:
FIG. 14 is a logic table illustrating selectable logic operation results implemented by a sensing circuitry in accordance with a number of embodiments of the present disclosure.

FIG. 14 is a logic table illustrating selectable logic operation results implementable by the sensing circuitry shown in FIG. 13 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1306 and compute component 1331. The four control signals (e.g., TF, TT, FT, and FF), in conjunction with a particular data value present on the complementary sense lines, controls the pass gates 1393-1 and 1393-2 and swap transistors 1342, which in turn affects the data value in the compute component 1331 and/or sense amplifier 1306 before/after firing. The capability to selectably control the swap transistors 1342 facilitates implementing logical operations involving inverse data values (e.g., inverse operands and/or inverse result), among others.

The logic table illustrated in FIG. 14 shows the starting data value stored in the compute component 1331 shown in column A at 1444, and the starting data value stored in the sense amplifier 1306 shown in column B at 1445. The other 3 top column headings (NOT OPEN, OPEN TRUE, and OPEN INVERT) in the logic table of FIG. 14 refer to the state of the pass gates 1393-1 and 1393-2, and the swap transistors 1342, which can respectively be controlled to be OPEN or CLOSED depending on the state of the four logic selection control signals (e.g., TF, TT, FT, and FF), in conjunction with a particular data value present on the pair of complementary sense lines 1305-1 and 1305-2 when the ISO control signal is asserted. The "Not Open" column corresponds to the pass gates 1393-1 and 1393-2 and the swap transistors 1342 both being in a non-conducting (e.g., off) condition, the "Open True" corresponds to the pass gates 1393-1 and 1393-2 being in a conducting (e.g., on) condition, and the "Open Invert" corresponds to the swap transistors 1342 being in a conducting condition. The configuration corresponding to the pass gates 1393-1 and 1393-2 and the swap transistors 1342 both being in a conducting condition is not reflected in the logic table of FIG. 14 since this results in the sense lines being shorted together.

Via selective control of the pass gates 1393-1 and 1393-2 and the swap transistors 1342, each of the three columns of the first set of two rows of the upper portion of the logic table of FIG. 14 can be combined with each of the three columns of the second set of two rows below the first set to provide 3×3=9 different result combinations, corresponding to nine different logical operations, as indicated by the various connecting paths shown at 1475. The nine different selectable logical operations that can be implemented by the sensing circuitry 1350 are summarized in the logic table illustrated in FIG. 14.

The columns of the lower portion of the logic table illustrated in FIG. 14 show a heading 1480 that includes the state of logic selection control signals. For example, the state of a first logic selection control signal (e.g., FF) is provided in row 1476, the state of a second logic selection control signal (e.g., FT) is provided in row 1477, the state of a third logic selection control signal (e.g., TF) is provided in row 1478, and the state of a fourth logic selection control signal (e.g., TT) is provided in row 1479. The particular logical operation corresponding to the results is summarized in row 1447.

As such, the sensing circuitry shown in FIG. 13 can be used to perform various logical operations as shown in FIG. 14. For example, the sensing circuitry 1350 can be operated to perform various logical operations (e.g., AND and OR logical operations) in association with storing a data value in multiple columns in accordance with a number of embodiments of the present disclosure.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
  an array of memory cells;
  sensing circuitry coupled to the array; and
  a control component coupled to the sensing circuitry and including a sequencer having a register configured to store a first plurality of digits representing a numerical value;
  wherein the control component is configured to operate the sensing circuitry to store the first plurality of digits representing the numerical value in multiple columns of the array by:
    causing storing of a mask from a row of the array into the sensing circuitry, wherein the mask comprises a second plurality of digits corresponding to respective columns of the array and indicating whether or not the first plurality of digits are to be stored in a particular column; and
    for each digit of the first plurality of digits, causing storing of the digit, in parallel, to respective particular columns of the array as indicated by the mask by:
      responsive to the digit having a particular data value, performing, in parallel, a logical operation between the digits of the mask and respective digits stored in the respective particular columns of the array as indicated by the mask; and responsive the digit having a different particular data value, foregoing performance of the logical operation between the digits of the mask and respective digits stored in the respective particular columns of the array as indicated by the mask.

2. The apparatus of claim 1, wherein the control component comprises:

a first output configured to select row addresses of the array; and a second output configured to provide executable instructions to the sensing circuitry, the executable instructions for performing the logical operation between the digits of the mask and respective digits stored in the respective particular columns of the array as indicated by the mask.

3. The apparatus of claim 2, wherein the logical operation is a logical OR operation.

4. The apparatus of claim 2, wherein control component is configured to increment the first output such that a different row is selected to correspond with respective digits of the first plurality of digits.

5. The apparatus of claim 2, wherein the control component is configured to perform the logical operation once for each "$i^{th}$" digit of the first plurality of digits representing the numerical value, with "i" being an index corresponding to digit position.

6. The apparatus of claim 5, wherein the "$i^{th}$" digit of each of the first plurality of digits stored in the multiple columns is stored in a same row.

7. The apparatus of claim 1, wherein the sensing circuitry comprises respective sense amplifier and compute component pairs on a per column basis.

8. The apparatus of claim 1, wherein the respective sense amplifier and compute component pairs are formed on pitch with memory cells of the array.

9. A method, comprising:

copying a value stored in a register of a sequencer to selected columns of a group of columns of an array of memory cells according to a mask stored in a first row of the array;

wherein the value stored in the register comprises multiple digits, and wherein copying the value stored in the register to selected columns includes:

loading the mask into sensing circuitry of the array; and responsive to determining that a first digit of the multiple digits of the value stored in the register has a first data value, performing, in parallel, a logical operation between digits of the mask corresponding to the group of columns and respective digits stored in memory cells located in the respective columns and in a second row of the array.

10. The method of claim 9, wherein the method includes transferring results of the logical operations from respective sensing circuitries to the respective memory cells located in the respective columns and in the second row of the array.

11. The method of claim 10, wherein the method includes, subsequent to transferring the results of the logical operations:

reloading the mask from the first row into the sensing circuitry of the array; and responsive to determining that a second digit of the multiple digits of the value stored in the register has the first data value, performing, in parallel, a logical operation between digits of the mask corresponding to the group of columns and respective digits stored in memory cells located in the respective columns and in a third row of the array.

12. The method of claim 10, wherein the method includes, subsequent to transferring the results of the logical operations:

reloading the mask from the first row into the sensing circuitry of the array; and responsive to determining that a second digit of the multiple digits of the value stored in the register has a data value other than the first data value, foregoing performing a logical operation between digits of the mask corresponding to the group of columns and respective digits stored in memory cells located in the respective columns and in a third row of the array.

13. The method of claim 9, wherein the method includes, prior to copying the value to the selected columns, setting digits stored in cells in which the value is to be stored to a same data value.

14. The method of claim 9, wherein performing the logical operation includes performing a logical OR operation.

15. The method of claim 9, wherein the mask comprises a logical "1" at digit positions corresponding to the selected columns to which the value is to be copied and a logical "0" at digit positions corresponding to those columns of the group of columns to which the value is not to be copied.

16. The method of claim 9, wherein the method includes performing the logical operation without transferring data via an input/output line of the array.

17. An apparatus, comprising:

an array of memory cells;

sensing circuitry coupled to the array and comprising a plurality of sense amplifiers and corresponding compute components; and a control component coupled to the sensing circuitry and including a sequencer having a register configured to store a value comprising a plurality (B) of digits;

wherein the control component is configured to control copying of the value to multiple destination columns of the array, in parallel, via an iterative process comprising B iterations such that a quantity of iterations performed is independent of a quantity of the destination columns; and wherein copying of the value to the multiple destination columns comprises, for each of the B iterations:

loading a mask, from a first row of the array, into the compute components coupled to respective columns of the array;

responsive to a corresponding one of the digits of the value having a particular data value, performing, in parallel, a logical operation between the digits of the mask and respective digits stored in memory cells coupled to corresponding columns of the array and to a second row of the array corresponding to the particular iteration; and responsive to a corresponding one of the digits of the value having a different particular data value, foregoing performance of the logical operation.

* * * * *